United States Patent
Okamoto et al.

(10) Patent No.: US 10,651,371 B2
(45) Date of Patent: May 12, 2020

(54) MAGNETIC ELEMENT, PRESSURE SENSOR, MAGNETIC HEAD AND MAGNETIC MEMORY

(71) Applicant: Kabushiki Kaisha Toshiba, Tokyo (JP)

(72) Inventors: Kazuaki Okamoto, Kanagawa (JP);
Yoshihiko Fuji, Kanagawa (JP);
Yoshihiro Higashi, Ishikawa (JP);
Michiko Hara, Kanagawa (JP); Shiori Kaji, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 232 days.

(21) Appl. No.: 15/699,813

(22) Filed: Sep. 8, 2017

(65) Prior Publication Data
US 2018/0226572 A1  Aug. 9, 2018

(30) Foreign Application Priority Data
Feb. 7, 2017  (JP) ................. 2017-020431

(51) Int. Cl.
*H01L 43/10* (2006.01)
*G11C 11/16* (2006.01)
(Continued)

(52) U.S. Cl.
CPC ............ *H01L 43/10* (2013.01); *B32B 15/043* (2013.01); *G11C 11/161* (2013.01); *H01L 43/02* (2013.01);
(Continued)

(58) Field of Classification Search
None
See application file for complete search history.

(56) References Cited

U.S. PATENT DOCUMENTS

| 6,146,775 A | 11/2000 | Fujita et al. |
| 2002/0008946 A1 | 1/2002 | Noma |

(Continued)

FOREIGN PATENT DOCUMENTS

| JP | 11-74123 | 3/1993 |
| JP | 2001-358381 A | 12/2001 |

(Continued)

OTHER PUBLICATIONS

Deziel, Chris. "How to Calculate Interplanar Spacing" sciencing.com, https://sciencing.com/calculate-interplanar-spacing-5628163.html. Apr. 11, 2018. (Year: 2018).*

(Continued)

*Primary Examiner* — Kevin M Bernatz
(74) *Attorney, Agent, or Firm* — Finnegan, Henderson, Farabow, Garrett & Dunner, L.L.P.

(57) ABSTRACT

According to an embodiment, a magnetic element includes a first layer, a first magnetic layer, a second magnetic layer, a first nonmagnetic layer, a second layer, and a third magnetic layer. The first layer includes ruthenium. The second magnetic layer is provided between the first layer and the first magnetic layer. The first nonmagnetic layer provided between the first magnetic layer and the second magnetic layer. The second layer includes tantalum. The second layer contacts the first layer and is provided between the first layer and the second magnetic layer. A lattice plane spacing of the second layer in a first direction is not less than 0.23 nm and not more than 0.25 nm. The first direction is from the first layer toward the first magnetic layer. The third magnetic layer includes manganese. The third magnetic layer is provided between the second layer and the second magnetic layer.

11 Claims, 24 Drawing Sheets

(51) Int. Cl.
  *G11B 5/39* (2006.01)
  *H01L 43/02* (2006.01)
  *B32B 15/04* (2006.01)
  *H01L 43/08* (2006.01)
  *G11B 5/48* (2006.01)
  *H01L 27/22* (2006.01)

(52) U.S. Cl.
  CPC ........ *H01L 43/08* (2013.01); *B32B 2307/208* (2013.01); *B32B 2457/00* (2013.01); *G11B 5/3906* (2013.01); *G11B 5/4833* (2013.01); *H01L 27/222* (2013.01); *H01L 27/228* (2013.01)

(56) References Cited

U.S. PATENT DOCUMENTS

| | | | |
|---|---|---|---|
| 2004/0165321 A1 | 8/2004 | Hasegawa et al. | |
| 2007/0165330 A1* | 7/2007 | Yamaguchi | G11B 5/3113 360/125.33 |
| 2007/0183101 A1* | 8/2007 | Yoon | B82Y 25/00 360/324.2 |
| 2008/0074799 A1* | 3/2008 | Ishiwata | B82Y 10/00 360/314 |
| 2008/0090307 A1* | 4/2008 | Xiao | H01L 43/08 438/3 |
| 2008/0239591 A1* | 10/2008 | Fuji | B82Y 10/00 360/324.12 |
| 2009/0053888 A1* | 2/2009 | Ding | C23C 14/0641 438/627 |
| 2016/0003697 A1* | 1/2016 | Okamoto | G01L 9/0041 73/862.632 |
| 2016/0009545 A1* | 1/2016 | Fuji | G01L 9/0042 257/419 |
| 2016/0258824 A1* | 9/2016 | Fuji | G01L 1/12 |
| 2016/0282146 A1* | 9/2016 | Ueda | G01R 33/09 |
| 2018/0322994 A1* | 11/2018 | Rahman | H01L 43/08 |

FOREIGN PATENT DOCUMENTS

| | | |
|---|---|---|
| JP | 2002-151755 | 5/2002 |
| JP | 2002-289946 | 10/2002 |
| JP | 2004-259914 A | 9/2004 |
| JP | 2007-305610 | 11/2007 |
| JP | 2013-045800 | 3/2013 |
| JP | 2016-015412 | 1/2016 |
| JP | 2016-161410 A | 9/2016 |

OTHER PUBLICATIONS

Yoo et al. (IEEE Trans. Mag., 38(5), 2002, 2715-2717). (Year: 2002).*

Y.M. Lee et al. "Giant tunnel magnetoresistance and high annealing stability in CoFeB/MgO/CoFeB magnetic tunnel junctions with synthetic pinned layer", Appl. Phys. Lett. 89, pp. 042506-1 to 042506-3 (2006).

* cited by examiner

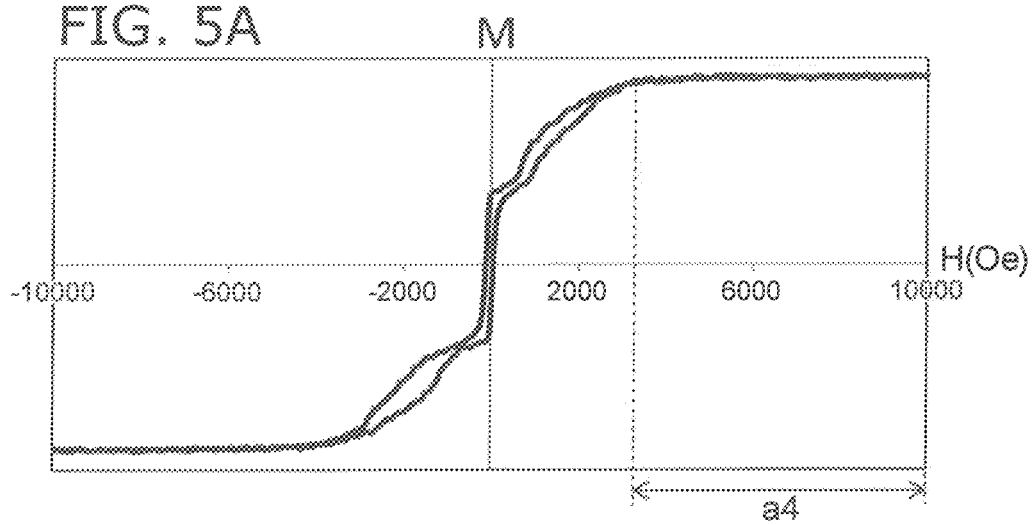
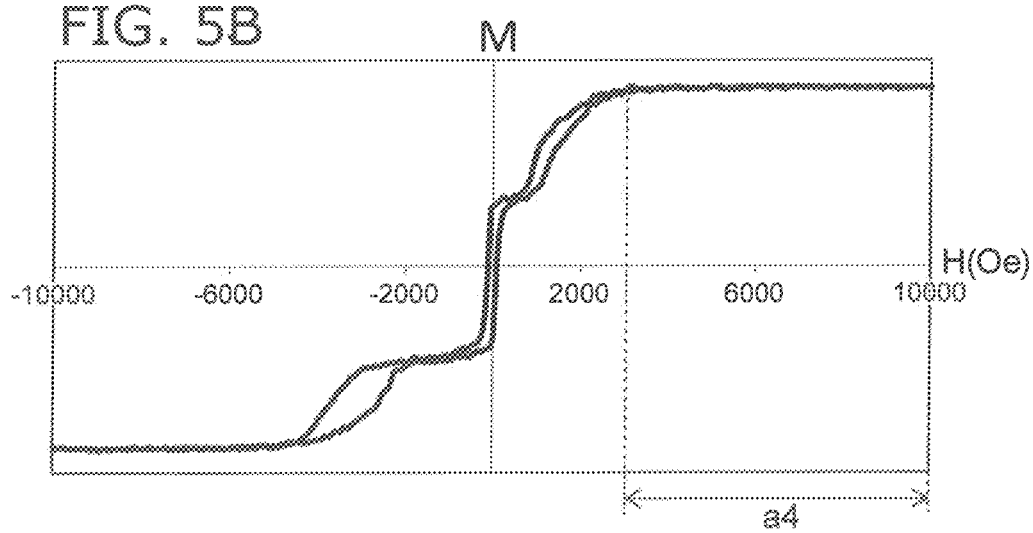
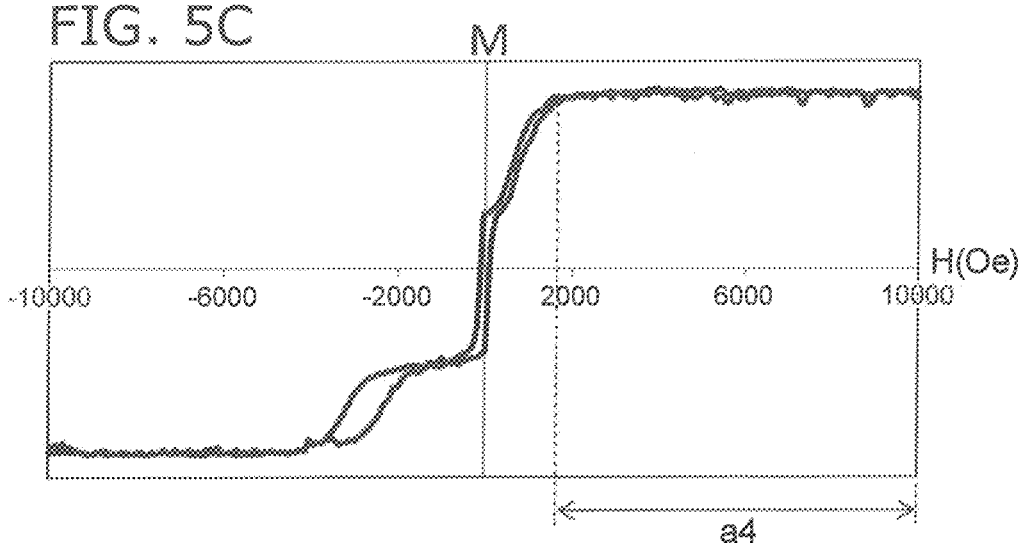

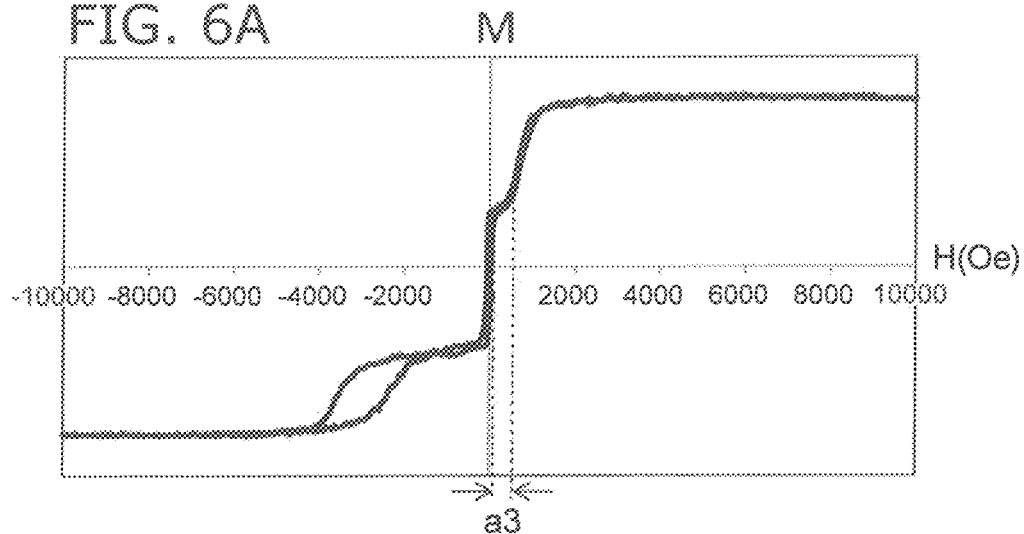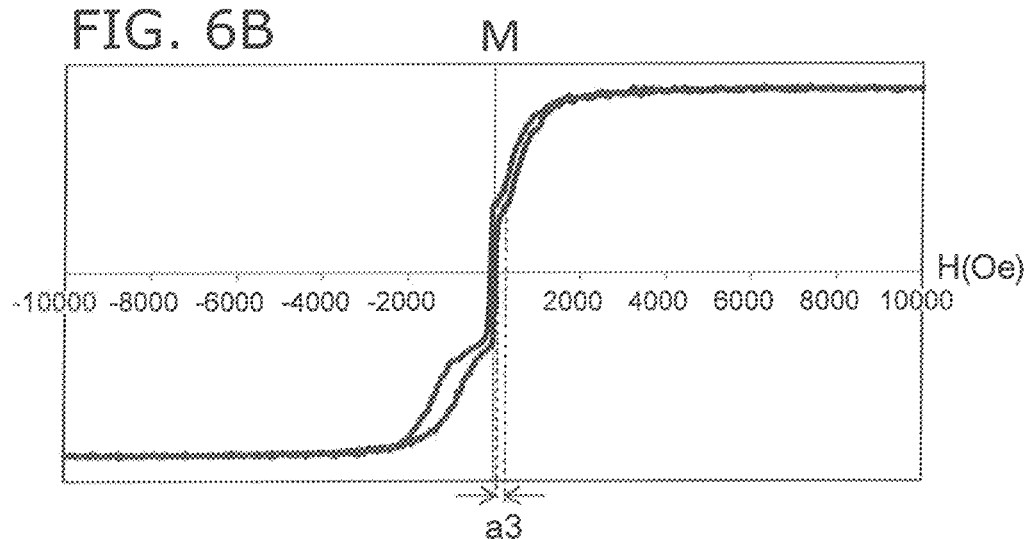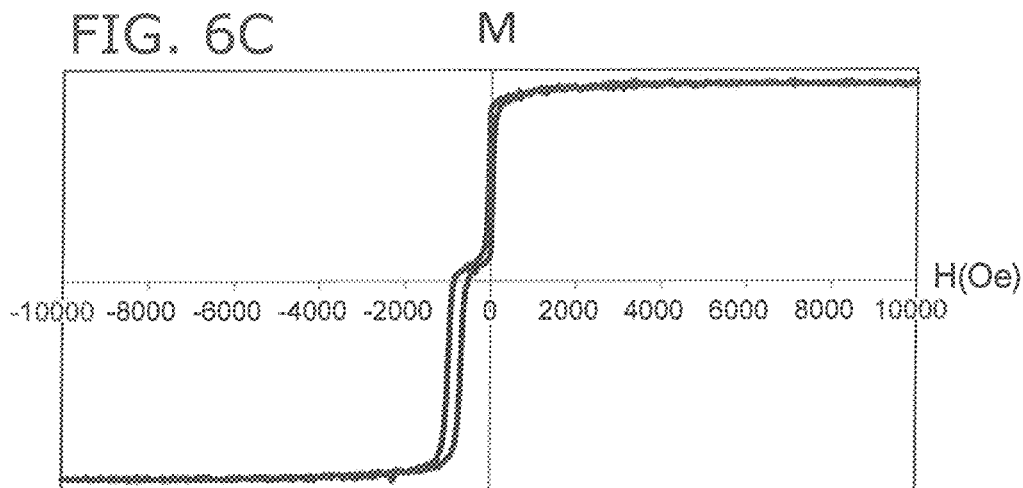

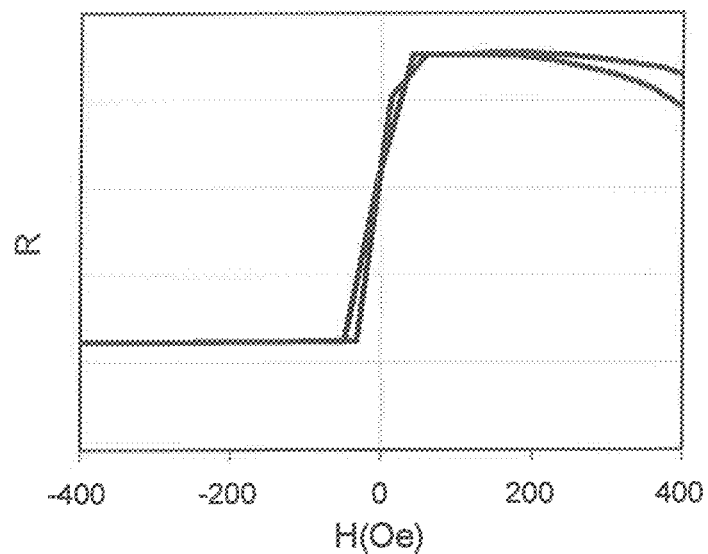
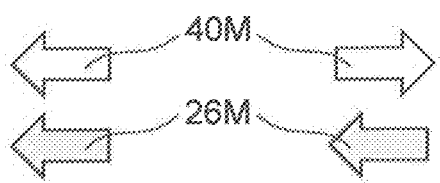
FIG. 8A
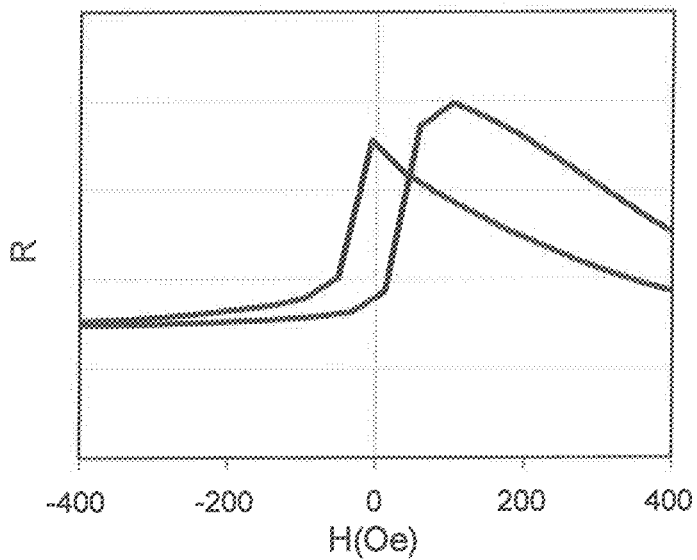
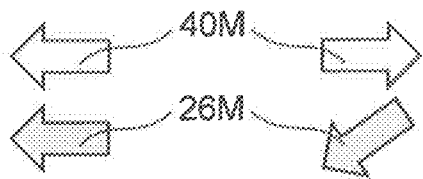
FIG. 8B

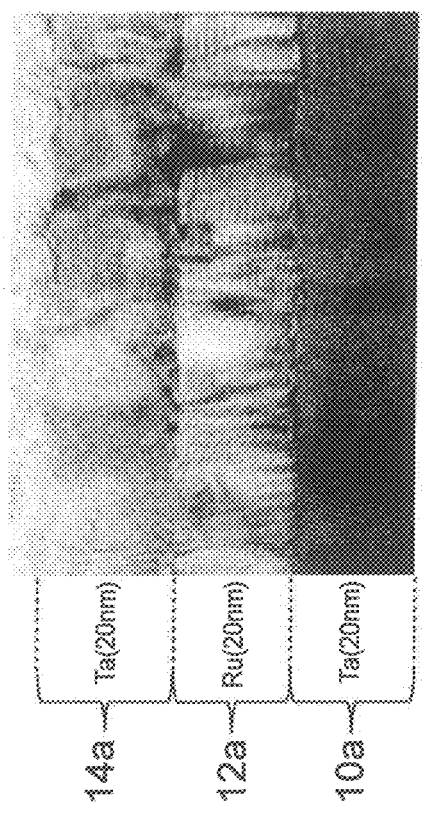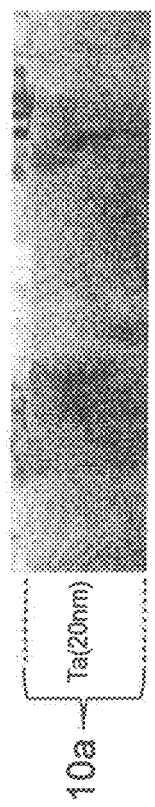
FIG. 15A
FIG. 15B

US 10,651,371 B2

MAGNETIC ELEMENT, PRESSURE SENSOR, MAGNETIC HEAD AND MAGNETIC MEMORY

CROSS-REFERENCE TO RELATED APPLICATIONS

This application is based upon and claims the benefit of priority from Japanese Patent Application No. 2017-020431, filed on Feb. 7, 2017; the entire contents of which are incorporated herein by reference.

FIELD

Embodiments described herein relate generally to a magnetic element, a pressure sensor, a magnetic head, and a magnetic memory.

BACKGROUND

A high magnetoresistance change rate (MR ratio) of a magnetic element is desirable.

BRIEF DESCRIPTION OF THE DRAWINGS

FIG. 5A to FIG. 5C are the measurement results of the samples subjected to the heat treatment at 380° C.;

FIG. 6A to FIG. 6C are the measurement results of the samples subjected to the heat treatment at 420° C.;

FIG. 8A and FIG. 8B are the measurement results of the relationship (the R-H loop) between the resistance and the external magnetic field of the samples;

FIG. 15A and FIG. 15B are the observation results of the samples;

DETAILED DESCRIPTION

Figure 1:
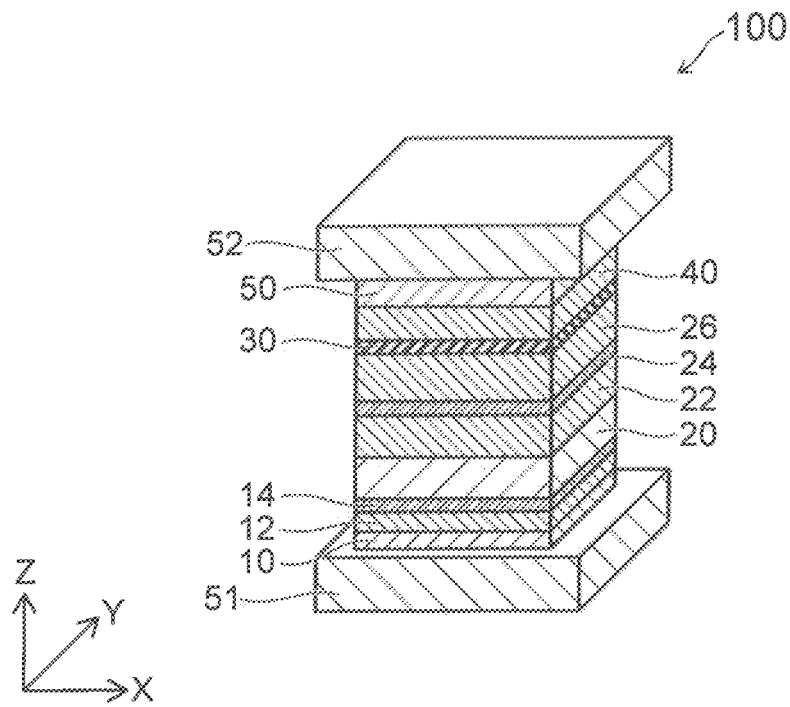
FIG. 1 is a perspective view illustrating a magnetic element according to a first embodiment.

According to an embodiment; a magnetic element includes a first layer, a first magnetic layer, a second magnetic layer, a first nonmagnetic layer, a second layer, and a third magnetic layer. The first layer includes ruthenium. The second magnetic layer is provided between the first layer and the first magnetic layer. The first nonmagnetic layer provided between the first magnetic layer and the second magnetic layer. The second layer includes tantalum. The second layer contacts the first layer. The second layer is provided between the first layer and the second magnetic layer. A lattice plane spacing of the second layer in a first direction is not less than 0.23 nm and not more than 0.25 nm. The first direction is from the first layer toward the first magnetic layer. The third magnetic layer includes manganese. The third magnetic layer is provided between the second layer and the second magnetic layer.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

The notation "material A/material B" indicates a state in which a layer of the material B is provided on a layer of the material A.

First Embodiment

FIG. 1 is a perspective view illustrating a magnetic element according to a first embodiment.

Figure 2:
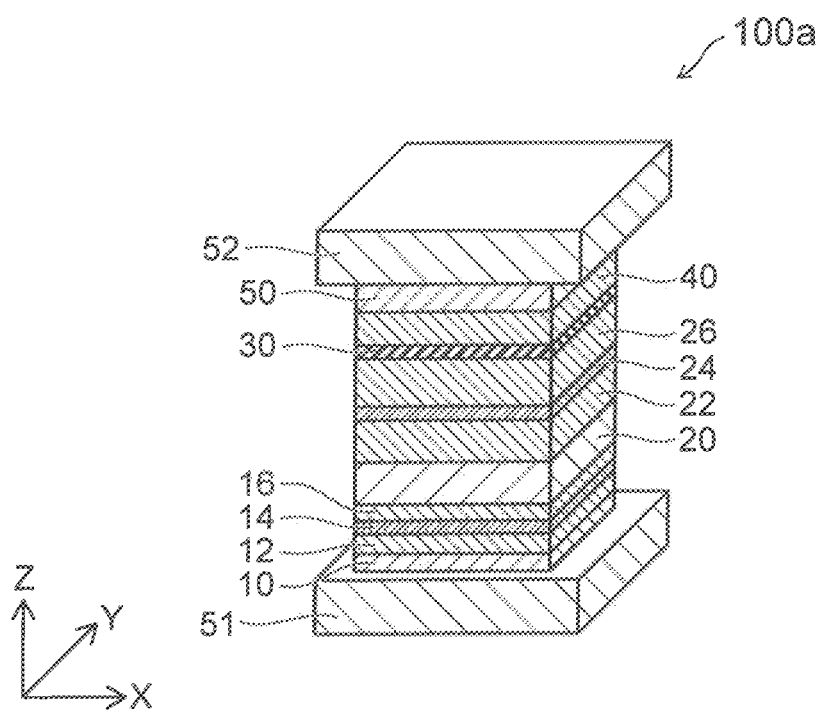
FIG. 2 is a perspective view illustrating another magnetic element according to the first embodiment.

FIG. 2 is a perspective view illustrating another magnetic element according to the first embodiment.

As illustrated in FIG. 1, the magnetic element 100 includes a first electrode 51, a fourth layer 10, a first layer 12, a second layer 14, a third magnetic layer 20, a fourth magnetic layer 22, a second nonmagnetic layer 24, a second magnetic layer 26, a first nonmagnetic layer 30, a first magnetic layer 40, a capping layer 50, and a second electrode 52.

The first layer 12 is provided between the fourth layer 10 and the second electrode 52. The second layer 14 is provided between the first layer 12 and the second electrode 52. The second layer 14 contacts the first layer 12. The third magnetic layer 20 is provided between the second layer 14 and the second electrode 52. The fourth magnetic layer 22 is provided between the third magnetic layer 20 and the second electrode 52. The second nonmagnetic layer 24 is provided between the fourth magnetic layer 22 and the second electrode 52.

The second magnetic layer 26 is provided between the second nonmagnetic layer 24 and the second electrode 52. The first nonmagnetic layer 30 is provided between the second magnetic layer 26 and the second electrode 52. The first magnetic layer 40 is provided between the first nonmagnetic layer 30 and the second electrode 52. The capping layer 50 is provided between the first magnetic layer 40 and the second electrode 52.

As in the magnetic element 100a illustrated in FIG. 2, a third layer 16 may be provided between the second layer 14 and the third magnetic layer 20.

The fourth layer 10 functions as, for example, a buffer layer. In the case where the fourth layer 10 is too thin, the function as the buffer layer weakens. In the case where the fourth layer 10 is too thick, the magnetic element 100 becomes excessively thick. Therefore, it is favorable for the thickness of the fourth layer 10 to be not less than 0.5 nm and not more than 10 nm. More favorably, the thickness of the fourth layer 10 is not less than 1 nm and not more than 5 nm. The fourth layer 10 is, for example, a tantalum (Ta) layer having a thickness of 1 nm.

The first layer 12 is, for example, a ruthenium (Ru) layer having a hexagonal close-packed (hcp) structure. Or, a nickel-iron (NiFe) layer having a face-centered cubic (fcc) structure, a copper (Cu) layer having a fee structure, or chrome (Cr) having a body-centered cubic (bcc) structure may be used.

A not-illustrated buffer layer may be provided between the fourth layer 10 and the first layer 12. The buffer layer relaxes the roughness of the surface of the fourth layer 10 and improves the crystallinity of the layer provided on the buffer layer. The buffer layer includes, for example, at least one selected from the group consisting of tantalum (Ta), titanium (Ti), vanadium (V), tungsten (W), zirconium (Zr), hafnium (Hf), and chrome (Cr). The material of the buffer layer may be an alloy including at least one material selected from these materials.

The second layer 14 is, for example, a Ta layer. It Is favorable for the thickness of the Ta layer to be, for example, not less than 1 atomic layer thick and not more than 5 nm. More favorably, the thickness of the Ta layer is not less than 0.5 nm and not more than 3 nm. By using a thin second layer 14, the thickness of the magnetic element according to the embodiment can be thin.

The second layer 14 may include $Ta_xM_{100-x}$. M is a nonmagnetic element or a metallic element. It is favorable for x to be not less than 90 atomic % and not more than 100 atomic %. In other words, it is favorable for the composition ratio of Ta in the second layer 14 to be 90% or more. The lattice constant, plane spacing, etc., of the second layer 14 may be controlled by adding the nonmagnetic element or the metallic element. Molybdenum (Mo) may be used as such a nonmagnetic element or such a metallic element. In the case where the second layer 14 includes $Ta_xM_{100-x}$, it is favorable for the thickness of the second layer 14 to be not less than 1 atomic layer thick and not more than 5 nm. More favorably, the thickness of the second layer 14 is not less than 0.5 nm and not more than 3 nm.

At least a portion of the second layer 14 has a bcc structure having the (110) orientation. By providing the second layer 14, it is possible to increase the crystallinity of the layers provided on the second layer 14.

It is favorable for the lattice plane spacing (hereinbelow, called simply the plane spacing) in a first direction of the second layer 14 to be not less than 0.22 nm and not more than 0.26 nm. More favorably, the plane spacing in the first direction of the second layer 14 is not less than 0.23 nm and not more than 0.25 nm. The first direction is the direction from the first layer 12 toward the first magnetic layer 40. The first direction is, for example, a Z-direction illustrated in FIG. 1. The first direction is taken to be the Z-direction in the description recited below.

The second layer 14 includes, for example, α-Ta having the (110) orientation in which the plane spacing in the Z-direction is 0.234 nm. By providing the second layer 14, the crystallinity of the third magnetic layer 20 can be increased compared to the case where the second layer 14 is not provided.

In the case where a third layer 16 is provided between the second layer 14 and the third magnetic layer 20, the third layer 16 functions as, for example, a seed layer. By providing the third layer 16 having the function as the seed layer, for example, it is possible to Increase the orientation of the crystal layers provided higher than the third layer 16. The third layer 16 is, for example, a Ru layer having a thickness of 2 nm.

Or, by providing the third layer 16, for example, the crystal orientation of the layers provided on the third layer 16 can be controlled. Or, by providing the third layer 16, it is possible to control the crystal grain sizes of the layers provided on the third layer 16. As the third layer 16, for example, a metal having a fcc structure, a hcp structure, a bcc structure, or the like is used.

A ruthenium (Ru) layer having a hcp structure, a NiFe layer having a fcc structure, a Cu layer having a fcc structure, or a chrome (Cr) layer having a bcc structure is used favorably as the third layer 16. By using any of these layers, for example, the crystal orientation of the layers provided on the third layer 16 can be set to the fcc (111) orientation. For example, a Cu layer having a thickness of 2 nm or a Ru layer having a thickness of 2 nm is used as the third layer 16. To increase the crystal orientation of the layers provided on the third layer 16, it is favorable for the thickness of the third layer 16 to be not less than 0.5 nm and not more than 5 nm. It is more favorable for the thickness of the third layer 16 to be not less than 1 nm and not more than 3 nm. Thereby, the function as a seed layer that Improves the crystal orientation can be realized sufficiently.

The third magnetic layer 20 is, for example, an iridium-manganese (IrMn) layer having a thickness of 7 nm. The fourth magnetic layer 22 is, for example, a $Co_{75}Fe_{25}$ layer having a thickness of 2.5 nm. The second nonmagnetic layer 24 is, for example, a Ru layer having a thickness of 0.9 nm.

The second magnetic layer 26 is, for example, a $Co_{40}Fe_{40}B_{20}$ layer having a thickness of 3 nm. The first nonmagnetic layer 30 is, for example, a MgO layer having a thickness of 1.6 nm. The first magnetic layer 40 is, for example, a $Co_{40}Fe_{40}B_{20}$ layer having a thickness of 4 nm.

The capping layer 50 includes, for example, a Ru layer, and a Ta layer provided between the Ru layer and the first magnetic layer 40. The thickness of the Ta layer is, for example, 1 nm. The thickness of the Ru layer is, for example, 5 nm.

The first electrode 51 and the second electrode 52 include, for example, at least one of aluminum (Al), aluminum copper alloy (Al—Cu), copper (Cu), silver (Ag), tantalum (Ta), or gold (Au). These materials are favorable to reduce the electrical resistances of the first electrode 51 and the second electrode 52. The first electrode 51 and the second electrode 52 include nonmagnetic materials.

The magnetic elements 100 and 100a according to the first embodiment Include the first layer 12 and the second layer 14. The first layer 12 includes Ru; and the second layer 14 includes Ta. The second layer 14 satisfies at least one of the following three conditions. The first condition is that the lattice plane spacing in the Z-direction of the second layer 14 is not less than 0.23 nm and not more than 0.25 nm. The second condition is that at least a portion of the second layer 14 has a body-centered cubic structure having the (110) orientation. The third condition is that the thickness in the Z-direction of the second layer 14 is not less than 1 atomic layer thick but less than 5 nm. By satisfying at least one of these conditions, the MR ratio of the magnetic element can be increased as described below.

For example, unidirectional anisotropy is provided to the fourth magnetic layer 22 formed on the third magnetic layer 20 by performing heat treatment in a magnetic field; and the third magnetic layer 20 makes it difficult for the magnetization direction of the fourth magnetic layer 22 to change. The third magnetic layer 20 functions as a pinning layer. The third magnetic layer 20 is, for example, an antiferromagnetic layer including an antiferromagnetic material such as manganese (Mn), etc. It is favorable for the composition ratio of manganese in the third magnetic layer 20 to be 70% or more. The third magnetic layer 20 includes, for example, at least one selected from the group consisting of Ir—Mn, Pt—Mn, Pd—Pt—Mn, Ru—Mn, Rh—Mn, Ru—Rh—Mn, Fe—Mn, Ni—Mn, Cr—Mn—Pt, and Ni—O.

The third magnetic layer 20 may include an alloy in which an added element is further added to at least one selected from the group consisting of Ir—Mn, Pt—Mn, Pd—Pt—Mn, Ru—Mn, Rh—Mn, Ru—Rh—Mn, Fe—Mn, Ni—Mn, Cr—Mn—Pt, and Ni—O. The thickness of the third magnetic layer 20 is set appropriately. Thereby, for example, a sufficiently strong unidirectional anisotropy is provided to the fourth magnetic layer 22.

For example, heat treatment is performed while applying a magnetic field in the manufacturing processes of the magnetic element according to the embodiment. Thereby, the orientation of the magnetization of the magnetic layer adjacent to the third magnetic layer 20 does not change easily (is magnetized). The orientation of the magnetization of the magnetic layer adjacent to the third magnetic layer 20 is aligned with the orientation of the magnetic field applied in the heat treatment. The heat treatment temperature (the annealing temperature) is, for example, not less than the magnetization pinning temperature of the antiferromagnetic material included in the third magnetic layer 20.

By increasing the temperature in the heat treatment, for example, in the case where the first nonmagnetic layer 30 includes magnesium oxide (MgO), the MR ratio can be increased by improving the crystallinity of the first nonmagnetic layer 30. On the other hand, in the case where an antiferromagnetic layer including Mn is used, there are cases where the diffusion of Mn into the layers other than the third magnetic layer 20 increases and the MR ratio decreases when increasing the temperature in the heat treatment.

Therefore, it is desirable for the heat treatment temperature to be smaller than the temperature at which the excessive diffusion of Mn occurs. In other words, a high MR ratio can be obtained by performing heat treatment at a high temperature in a magnetic element in which the diffusion of Mn does not occur easily. The heat treatment temperature is, for example, not less than 200° C. and not more than 600° C. Favorably, the heat treatment temperature is, for example, not less than 250° C. and not more than 500° C.

In the case where the third magnetic layer 20 is a PtMn-layer or a PdPtMn-layer, it is favorable for the thickness of the third magnetic layer 20 to be not less than 8 nm and not more than 30 nm. More favorably, the thickness of the third magnetic layer 20 is not less than 10 nm and not more than 25 nm. The thickness that is necessary for providing the unidirectional anisotropy to the fourth magnetic layer 22 can be thinner for the case where the third magnetic layer 20 is the IrMn-layer than for the case where the third magnetic layer 20 is the PtMn-layer. In the case where the third magnetic layer 20 is the IrMn-layer, it is favorable for the thickness of the third magnetic layer 20 to be not less than 4 nm and not more than 18 nm. More favorably, the thickness of the third magnetic layer 20 is not less than 5 nm and not more than 15 nm. The third magnetic layer 20 is, for example, an $Ir_{22}Mn_{78}$ layer having a thickness of 7 nm.

The third magnetic layer 20 may be a hard magnetic layer. For example, Co—Pt, Fe—Pt, Co—Pd, Fe—Pd, or the like is used as the material of the hard magnetic layer. For example, these materials have relatively high magnetic anisotropies and coercivities. These materials are hard magnetic materials. The third magnetic layer 20 may be an alloy layer in which an added element is added to Co—Pt, Fe—Pt, Co—Pd, or Fe—Pd.

The third magnetic layer 20 may be a CoPt layer in which the proportion of Co is not less than 50 atomic % and not more than 85 atomic %. Or, the third magnetic layer 20 may be a $(Co_xPt_{100-x})_{100-y}Cr_y$ layer. x is not less than 50 atomic % and not more than 85 atomic %; and y is not less than 0 atomic % and not more than 40 atomic %. Or, the third magnetic layer 20 may be an FePt layer in which the proportion of Pt is not less than 40 atomic % and not more than 60 atomic %.

The fourth magnetic layer 22 includes a ferromagnet material. The fourth magnetic layer 22 includes, for example, at least one selected from the group consisting of Co, Fe, and Ni. The fourth magnetic layer 22 is, for example, a $Co_xFe_{100-x}$ alloy layer (0 atomic %≤x≤100 atomic %). Or, the fourth magnetic layer 22 may be a $N_xFe_{100-x}$ alloy layer (0 atomic %≤x≤100 atomic %). A nonmagnetic element may be added to these materials.

An alloy that includes at least one selected from the group consisting of Co, Fe, and Ni may be used as the material of the fourth magnetic layer 22. The fourth magnetic layer 22 is, for example, a $(Co_xFe_{100-x})_{100-y}B_y$ alloy layer. x is not less than 0 atomic % and not more than 100 atomic %; and y is not less than 0 atomic % and not more than 30 atomic %. The fluctuation of the characteristics of the magnetic element according to the embodiment can be suppressed even in the case where the element size is small by using an amorphous alloy layer of $(Co_xFe_{100-x})_{100-y}B_y$ as the fourth magnetic layer 22.

It is favorable for the thickness of the fourth magnetic layer 22 to be, for example, not less than 1.5 nm and not more than 5 nm. In the case of such a thickness, for example, the strength of the unidirectional anisotropic magnetic field due to the third magnetic layer 20 can be stronger. By strengthening the strength of the unidirectional anisotropic magnetic field, for example, the strength of the antiferromagnetic coupling between the fourth magnetic layer 22 and the second magnetic layer 26 via the second nonmagnetic layer 24 can be stronger. For example, it is favorable for the magnetic thickness (the product of the saturation magnetization and the thickness) of the fourth magnetic layer 22 to be substantially equal to the magnetic thickness of the second magnetic layer 26.

The saturation magnetization of a thin film of $Co_{40}Fe_{40}B_{20}$ is about 1.9 T (teslas). For example, in the case where a $Co_{40}Fe_{40}B_{20}$ layer having a thickness of 3 nm is used as the second magnetic layer 26, the magnetic thickness of the second magnetic layer 26 is 1.9 T×3 nm, i.e., 5.7 Tnm. On the other hand, the saturation magnetization of $Co_{75}Fe_{25}$ is about 2.1 T. The thickness of the fourth magnetic layer 22 in which a magnetic thickness equal to that described above is obtained is 5.7 Tnm/2.1 T, i.e., 2.7 nm. In such a case, it is favorable for the fourth magnetic layer 22 to include a $Co_{75}Fe_{25}$ layer having a thickness of about 2.7 nm. For example, a $Co_{75}Fe_{25}$ layer having a thickness of 2.5 nm is used as the fourth magnetic layer 22.

The magnetic element according to the embodiment has, for example, a synthetic pinned structure. The synthetic pinned structure includes the fourth magnetic layer 22, the second nonmagnetic layer 24, and the second magnetic layer 26. Instead of the synthetic pinned structure, a single pinned structure including one magnetic layer may be used. In the case where the single pinned structure is used, for example, a $Co_{40}Fe_{40}B_{20}$ layer having a thickness of 3 nm is used as the magnetic layer. The magnetic layer that is used in the single pinned structure includes, for example, the same material as the material of the fourth magnetic layer 22 described above.

The second nonmagnetic layer 24 causes antiferromagnetic coupling to occur between the fourth magnetic layer 22 and the second magnetic layer 26. For example, Ru is used as the material of the second nonmagnetic layer 24. It is favorable for the thickness of the second nonmagnetic layer 24 to be not less than 0.8 nm and not more than 1 nm. If the material causes sufficient antiferromagnetic coupling to occur between the fourth magnetic layer 22 and the second magnetic layer 26, a material other than Ru may be used as the second nonmagnetic layer 24.

For example, the thickness of the second nonmagnetic layer 24 is set to a thickness not less than 0.8 nm and not more than 1 nm corresponding to the second peak (2nd peak) of RKKY (Ruderman-Kittel-Kasuya-Yosida) coupling. Further, the thickness of the second nonmagnetic layer 24 may be set to a thickness not less than 0.3 nm and not more than 0.6 nm corresponding to the first peak (1st peak) of RKKY coupling. For example, a Ru layer having a thickness of 0.9 nm is used as the second nonmagnetic layer 24. Thereby, a highly reliable coupling is obtained more stably.

The second magnetic layer 26 includes a ferromagnet material. The ferromagnet material that is included in the second magnetic layer 26 contributes more directly to the MR effect. The second magnetic layer 26 includes, for example, a Co—Fe—B alloy. Specifically, a $(Co_xFe_{100-x})_{100-y}B_y$ alloy layer may be used as the second magnetic layer 2. x is not less than 0 atomic % and not more than 100 atomic %; and y is not less than 0 atomic % and not more than 30 atomic %. By using an amorphous alloy layer of $(Co_xFe_{100-x})_{100-y}B_y$ as the second magnetic layer 26, for example, the fluctuation of the characteristics between the elements caused by the crystal grains can be suppressed even in the case where the size of the magnetic element is small.

The second magnetic layer 26 may have a stacked structure of alloys including at least one of Co, Fe, or B. It Is favorable for the composition ratios of each stacked structure to be different from each other. The second magnetic layer 26 has, for example, a stacked structure of $(Co_xFe_{100-x})_{100-y}B_y/(Co_zFe_{100-z})_{100-w}B_w$. x is not less than 0 atomic % and not more than 100 atomic %; and y is not less than 0 atomic % and not more than 30 atomic %. z is not less than 0 atomic % and not more than 100 atomic %; and w is not less than 0 atomic % and not more than 30 atomic %. By using such a stacked structure, it is possible to increase the compatibility of the lattice constants in the in-plane direction for the layers adjacent to the second magnetic layer 26 above and below without greatly changing the magnetic properties of the second magnetic layer 26.

By increasing the compatibility of the lattice constants in the in-plane direction, the first nonmagnetic layer 30 that is formed on the second magnetic layer 26 can be flatter. By the first nonmagnetic layer 30 being flatter, the defect density of the first nonmagnetic layer 30 can be reduced. Thereby, a lower resistance per area and a larger MR ratio are obtained. For example, in the case where MgO is used as the material of the first nonmagnetic layer 30, the (100) orientation of the MgO layer can be strengthened by using an amorphous alloy of $(Co_xFe_{100-x})_{100-y}B_y$ as the second magnetic layer 26. A larger MR ratio is obtained by further Increasing the (100) orientation of the MgO layer. The $(Co_xFe_{100-x})_{100-y}B_y$ alloy is crystallized by using the (100) plane of the MgO layer as a template when annealing. Therefore, good crystal conformation between the MgO and the $(Co_xFe_{100-x})_{100-y}B_y$ alloy is obtained. By obtaining the good crystal conformation, a larger MR ratio is obtained. Other than the Co—Fe—B alloy, for example, an Fe—Co alloy may be used as the second magnetic layer 26.

By setting the second magnetic layer 26 to be thicker, a larger MR ratio is obtained. In the case where the second magnetic layer 26 is thin, for example, a larger fixed magnetic field is obtained. A trade-off relationship that corresponds to the thickness of the second magnetic layer 26 exists between the MR ratio and the fixed magnetic field. In the case where a Co—Fe—B alloy is used as the second magnetic layer 26, it Is favorable for the thickness of the second magnetic layer 26 to be not less than 1.5 nm and not more than 5 nm. It is more favorable for the thickness of the second magnetic layer 26 to be not less than 2.0 nm and not more than 4.0 nm.

Instead of the materials described above, the second magnetic layer 26 may include a $Co_{90}Fe_{10}$ alloy having a fcc structure, Co having a hcp structure, or a Co alloy having a hcp structure. The second magnetic layer 26 includes, for example, at least one selected from the group consisting of Co, Fe, and Ni. Or, the material of the second magnetic layer 26 may include an alloy including at least one material selected from these materials. For example, a larger MR ratio is obtained by using an FeCo alloy material having a bcc structure, a Co alloy having a cobalt composition of 50% or more, or a material (a Ni alloy) having a Hi composition of 50% or more as the material of the second magnetic layer 26.

For example, a Heusler magnetic alloy layer of $Co_2MnGe$, $Co_2FeGe$, $Co_2MnSi$, $Co_2FeSi$, $Co_2MnAl$, $Co_2MnGa_{0.5}Ge_{0.5}$, $Co_2FeGa_{0.5}Ge_{0.5}$, etc., also may be used as the second magnetic layer 26.

For example, the first nonmagnetic layer 30 breaks the magnetic coupling between the second magnetic layer 26 and the first magnetic layer 40. The material of the first nonmagnetic layer 30 includes, for example, a metal, an insulator, or a semiconductor. For example, Cu, An, Ag, or the like is used as the metal included in the first nonmagnetic layer 30. In the case where the first nonmagnetic layer 30 includes a metal, the thickness of the intermediate layer is, for example, not less than 1 nm and not more than 7 nm. For example, magnesium oxide (MgO, etc.), aluminum oxide ($Al_2O_3$, etc.), titanium oxide (TiO, etc.), zinc oxide (ZnO, etc.), gallium oxide (Ga—O), or the like is used as the insulating material or the semiconductor material included in the first nonmagnetic layer 30. For example, a MgO layer having a thickness of 1.6 nm is used as the first nonmagnetic layer 30.

In the case where the first nonmagnetic layer 30 includes an insulating material or a semiconductor material, the thickness of the first nonmagnetic layer 30 is, for example, not less than 0.6 nm and not more than 5 nm. For example, a CCP (Current-Confined-Path) spacer layer may be used as the first nonmagnetic layer 30. In the case where the CCP spacer layer is used as the first nonmagnetic layer 30, for example, a structure is used in which a metal path of copper (Cu) is formed inside an insulating layer of aluminum oxide ($Al_2O_3$).

The first magnetic layer 40 includes a ferromagnet material. The first magnetic layer 40 includes, for example, a ferromagnet material including Fe, Co, and Ni. For example, an FeCo alloy, a NiFe alloy, or the like is used as the material of the first magnetic layer 40. Or, a Co—Fe—B alloy, an Fe—Co—Si—B alloy, an Fe—Ga alloy having a larger $\lambda$s (magnetostriction constant), an Fe—Co—Ga alloy, a Tb-M-Fe alloy, a Tb-M1-Fe-M2 alloy, an Fe-M3-M4-B alloy, Ni, Fe—Al, ferrite, etc., may be used as the material of the first magnetic layer 40.

For example, the $\lambda$s (the magnetostriction constant) is large for these materials. In the Tb-M-Fe alloy described above, M is at least one selected from the group consisting of Sm, Eu, Gd, Dy, Ho, and Er. In the Tb-M1-Fe-M2 alloy described above, M1 is at least one selected from the group consisting of Sm, Eu, Gd, Dy, Ho, and Er. M2 is at least one selected from the group consisting of Ti, Cr, Mn, Co, Cu, Mb, Mo, W, and Ta.

In the Fe-M3-M4-B alloy described above, M3 is at least one selected from the group consisting of Ti, Cr, Mn, Co, Cu, Nb, Mo, W, and Ta. M4 is at least one selected from the group consisting of Ce, Pr, Nd, Sm, Tb, Dy, and Er. $Fe_3O_4$, $(FeCo)_3O_4$, etc., are examples of the ferrite described above. The thickness of the first magnetic layer 40 is, for example, 2 nm or more.

The first magnetic layer 40 may Include a magnetic material including boron (B). The first magnetic layer 40 may Include, for example, an alloy including boron (B) and at least one element selected from the group consisting of Fe, Co, and Ni. The first magnetic layer 40 includes, for example, a Co—Fe—B alloy or an Fe—B alloy. The first magnetic layer 40 includes, for example, a $Co_{40}Fe_{40}B_{20}$ alloy.

Ga, Al, Si, W, etc., may be added in the case where the first magnetic layer 40 includes an alloy including boron (B) and at least one element selected from the group consisting of Fe, Co, and Ni. For example, high magnetostriction is promoted by adding these elements. For example, an Fe—Ga—B alloy, an Fe—Co—Ga—B alloy, or an Fe—Co—Si—B alloy may be used as the first magnetic layer 40. By using such a magnetic material including boron, the coercivity (Hc) of the first magnetic layer 40 is low and the change of the magnetization direction due to an external magnetic field and/or strain is easy. Thereby, high sensitivity is obtained in the case where the magnetic element according to the embodiment is used in a magnetic sensor or a strain sensor.

It is favorable for the boron (B) concentration (e.g., the composition ratio of boron) of the first magnetic layer 40 to be 5 atomic % (atomic percent) or more. Thereby, an amorphous structure is easier to obtain. It is favorable for the boron concentration of the first magnetic layer 40 to be 35 atomic % or less. For example, the magnetostriction constant decreases when the boron concentration is too high. For example, it is favorable for the boron concentration of the first magnetic layer 40 to be not less than 5 atomic % and not more than 35 atomic %; and it is more favorable to be not less than 10 atomic % and not more than 30 atomic %.

A portion of the magnetic layer of the first magnetic layer 40 includes, for example, $F_{100-y}B_y$ (0 atomic %<y≤30 atomic %) or $(Fe_zX_{100-z})_{100-y}B_y$ (X being Co or Ni, 80 atomic %≤z<100 atomic %, and 0 atomic %<y≤30 atomic %). In such a case, it is easy to realize both a large magnetostriction constant $\lambda$ and a low coercivity. Therefore, this is particularly favorable from the perspective of obtaining high sensitivity when the magnetic element according to the embodiment is used in a strain sensor. For example, $Fe_{80}B_{20}$ (4 nm) is used as the first magnetic layer 40. Or, $Co_{40}Fe_{40}B_{20}$ (0.5 nm)/$Fe_{80}B_{20}$ (4 nm) is used as the first magnetic layer 40.

The first magnetic layer 40 may have a multilayered structure. In the case where a tunneling insulating layer including MgO is used as the first nonmagnetic layer 30, it is favorable to provide a layer of a Co—Fe—B alloy at the portion of the first magnetic layer 40 contacting the first nonmagnetic layer 30. Thereby, a high magnetoresistance effect is obtained. In such a case, a layer of a Co—Fe—B alloy is provided on the first nonmagnetic layer 30; and another magnetic material that has a large magnetostriction constant is provided on the layer of the Co—Fe—B alloy. In the case where the first magnetic layer 40 has the multilayered structure, for example, the first magnetic layer 40 includes Co—Fe—B (2 nm)/Fe—Co—Si—B (4 nm), etc.

The first magnetic layer 40 may include an alloy including $Co_xFe_{100-x}$ (20 atomic %≤x≤80 atomic %) having a crystal structure. The first magnetic layer 40 may have a multilayered structure including an alloy layer including $Co_xFe_{100-x}$ (20 atomic %≤x≤80 atomic %) having a crystal structure. The first magnetic layer 40 may include an alloy including $Ni_yFe_{100-y}$ (50 atomic %≤x≤75 atomic %) having a crystal structure. The first magnetic layer 40 may have a multilayered structure including an alloy layer including $Ni_yFe_{100-y}$ (50 atomic %≤y≤75 atomic %) having a crystal structure.

The capping layer 50 protects the layers provided under the capping layer 50, The capping layer 50 includes, for example, multiple metal layers. The capping layer 50 includes, for example, a two-layer structure (Ta/Ru) of a Ta layer and a Ru layer. The thickness of the Ta layer is, for example, 1 nm; and the thickness of the Ru layer is, for example, 5 nm. As the capping layer 50, another metal layer may be provided instead of the Ta layer and/or the Ru layer. The configuration of the capping layer 50 is arbitrary. For example, a nonmagnetic material is used as the capping layer 50. Another material may be used as the capping layer 50 as long as the layers provided under the capping layer 50 can be protected.

In the case where the first magnetic layer 40 includes a magnetic material including boron, a diffusion suppression layer (not illustrated) including an oxide material and/or a nitride material may be provided between the first magnetic layer 40 and the capping layer 50. Thereby, for example, the diffusion of the boron included in the first magnetic layer 40 is suppressed. By suppressing the diffusion of boron, the amorphous structure of the first magnetic layer 40 is maintained more easily. For example, an oxide material or a nitride material including an element such as Mg, Al, Si, Ti, V, Cr, Mn, Fe, Co, Ni, Cu, Zn, Zr, Nb, Mo, Ru, Rh, Pd, Ag, Hf, Ta, W, Sn, Cd, Ga, or the like is used as the oxide material or the nitride material included in the diffusion suppression layer.

The diffusion suppression layer is a layer that does not contribute to the magnetoresistance effect. It is favorable for the resistance per area of the diffusion suppression layer to be low. For example, it is favorable for the resistance per area of the diffusion suppression layer to be set to be lower than the resistance per area of the nonmagnetic layer 30 that contributes to the magnetoresistance effect. From the perspective of reducing the resistance per area of the diffusion suppression layer, it is favorable for the diffusion suppression layer to include an oxide or a nitride of Mg, Ti, V, Zn, Sn, Cd, or Ga. The barrier height is low for these materials. It Is favorable to use an oxide having a stronger chemical bond to suppress the diffusion of boron. For example, a MgO layer of 1.5 nm is used. Oxynitrides are included in one of the oxide or the nitride.

In the case where the diffusion suppression layer includes an oxide or a nitride, it is favorable for the thickness of the diffusion suppression layer to be, for example, 0.5 nm or more. Thereby, the diffusion suppression function of the boron is realized sufficiently. It is favorable for the thickness of the diffusion suppression layer to be 5 nm or less. Thereby, for example, a low resistance per area is obtained. It is favorable for the thickness of the diffusion suppression layer to be not less than 0.5 nm and not more than 5 nm; and it is favorable to be not less than 1 nm and not more than 3 nm.

At least one selected from the group consisting of magnesium (Mg), silicon (Si), and aluminum (Al) may be used as the diffusion suppression layer. A material that includes these light elements is used as the diffusion suppression layer. These light elements produce compounds by bonding with boron. For example, at least one of a Mg—B compound, an Al—B compound, or a Si—B compound is formed at the portion including the interface between the diffusion suppression layer and the first magnetic layer 40. These compounds suppress the diffusion of boron.

Another metal layer, etc., may be inserted between the diffusion suppression layer and the first magnetic layer 40. In the case where the distance between the diffusion suppression layer and the first magnetic layer 40 is too long, boron diffuses between the diffusion suppression layer and the first magnetic layer 40; and the boron concentration in the first magnetic layer 40 undesirably decreases. Therefore, it is favorable for the distance between the diffusion suppression layer and the first magnetic layer 40 to be 10 nm or less; and it is more favorable to be 3 nm or less.

The first electrode 51 and the second electrode 52 may have stacked structures. The first electrode 51 and the second electrode 52 may include, for example, a foundation layer, a capping layer, and a layer including at least one of Al, Al—Cu, Cu, Ag, or Au provided between these layers. The first electrode 51 and the second electrode 52 each are, for example, a Ta layer/Cu layer/Ta layer.

By using Ta layers as the foundation layers of the first electrode 51 and the second electrode 52, for example, the adhesion between the substrate (e.g., the film) and the first electrode 51 improves; and the adhesion between the substrate and the second electrode 52 improves. A tantalum-molybdenum (TaMo) layer, a titanium (Ti) layer, a titanium nitride (TiN) layer, etc., may be used as the foundation layers of the first electrode 51 and the second electrode 52.

By using Ta layers as the capping layers of the first electrode 51 and the second electrode 52, the oxidization of the copper (Cu), etc., under the capping layer is suppressed. A tantalum-molybdenum (TaMo) layer, a titanium (Ti) layer, a titanium nitride (TiN) layer, etc., may be used as the capping layers of the first electrode 51 and the second electrode 52.

For example, the magnetic element 100 is made by the following method. The first electrode 51 of Ta (3 nm)/Cu (33 nm)/Ta (20 nm) is formed on a Si substrate. A Ta layer (the fourth layer 10) of 1 nm, a Ru layer (the first layer 12) of 2 nm, a Ta layer (the second layer 14) of 2 nm, an $Ir_{22}Mn_{70}$ layer (the third magnetic layer 20) of 7 nm, a $Co_{50}Fe_{50}$ layer (the fourth magnetic layer 22) of 2.5 nm, a Ru layer (the second nonmagnetic layer 24) of 0.9 nm, a $Co_{40}Fe_{40}B_{20}$ layer (the second magnetic layer 26) of 3 nm, a MgO layer (the first nonmagnetic layer 30) of 1.8 nm, and a $Co_{40}Fe_{40}B_{20}$ layer (the first magnetic layer 40) of 4.0 nm are sequentially formed on the first electrode 51 by using sputtering. The magnetic element 100 is made by using sputtering to form Mg—O (1.5 nm)/Cu (1 nm)/Ta (2 nm)/Ru (200 nm) on the first magnetic layer 40 as the capping layer 50 and to form the second electrode 52 on the capping layer.

In the method for making the magnetic element 100 described above, the second layer 14 is formed using, for example, the following conditions. The degree of vacuum inside the film formation chamber of the base is $3.0 \times 10^{-9}$ torr or less. In the sputtering film formation, the degree of vacuum inside the chamber is adjusted to $5.0 \times 10^{-3}$ torr by using argon (Ar) gas; and an electrical power of 1000 W is supplied to the target by a DC power supply. By applying these conditions, the second layer 14 that includes α-Ta having the (110) orientation and a plane spacing in the Z-direction of 0.234 nm can be formed.

The following first sample S01, second sample S02, and third sample S03 were made; and experiments were performed. The first sample S01 has the structure illustrated in FIG. 2. The specific configuration of the first sample S01 is as follows.

Fourth layer 10: Ta (1 nm)
First layer 12: Ru (2 nm)
Second layer 14; Ta (2 nm)
Third layer 16; Ru (2 nm)
Third magnetic layer 20: $Ir_{22}Mn_{78}$ (7 nm)
Fourth magnetic layer 22: $Co_{50}Fe_{50}$ (2.5 nm)
Second nonmagnetic layer 24: Ru (0.9 nm)
Second magnetic layer 26: $Co_{40}Fe_{40}B_{20}$ (3 nm)
First nonmagnetic layer 30: Mg—O (1.8 nm)
First magnetic layer 40: $Co_{40}Fe_{40}B_{20}$ (4.0 nm)
Capping layer 50: Mg—O (1.5 nm)/Cu (1 nm)/Ta (2 nm)/Ru (200 nm)

Compared to the first sample S01, the third layer 16 is not included in the second sample S02. In other words, the second sample S02 has the structure illustrated in FIG. 1.

Compared to the first sample S01, the second layer 14 and the third layer 16 are not included in the third sample S03. Other than the second layer 14 and the third layer 16, the configuration of the third sample S03 is similar to that of the first sample S01.

The thickness of the second nonmagnetic layer 24 is set so that the fourth magnetic layer 22 and the second magnetic layer 26 have antiparallel magnetic coupling. The first sample S01, the second sample S02, and the third sample S03 are made on the first electrode 51 of Ta (3 nm)/Cu (33 nm)/Ta (20 nm).

Heat treatment in a magnetic field for 1 hour is performed at 320° C., 380° C., and 420° C. for each of the first to third samples S01 to S03, The magnitude of the magnetic field applied in the heat treatment is set to 6500 oersteds.

Figure 3:
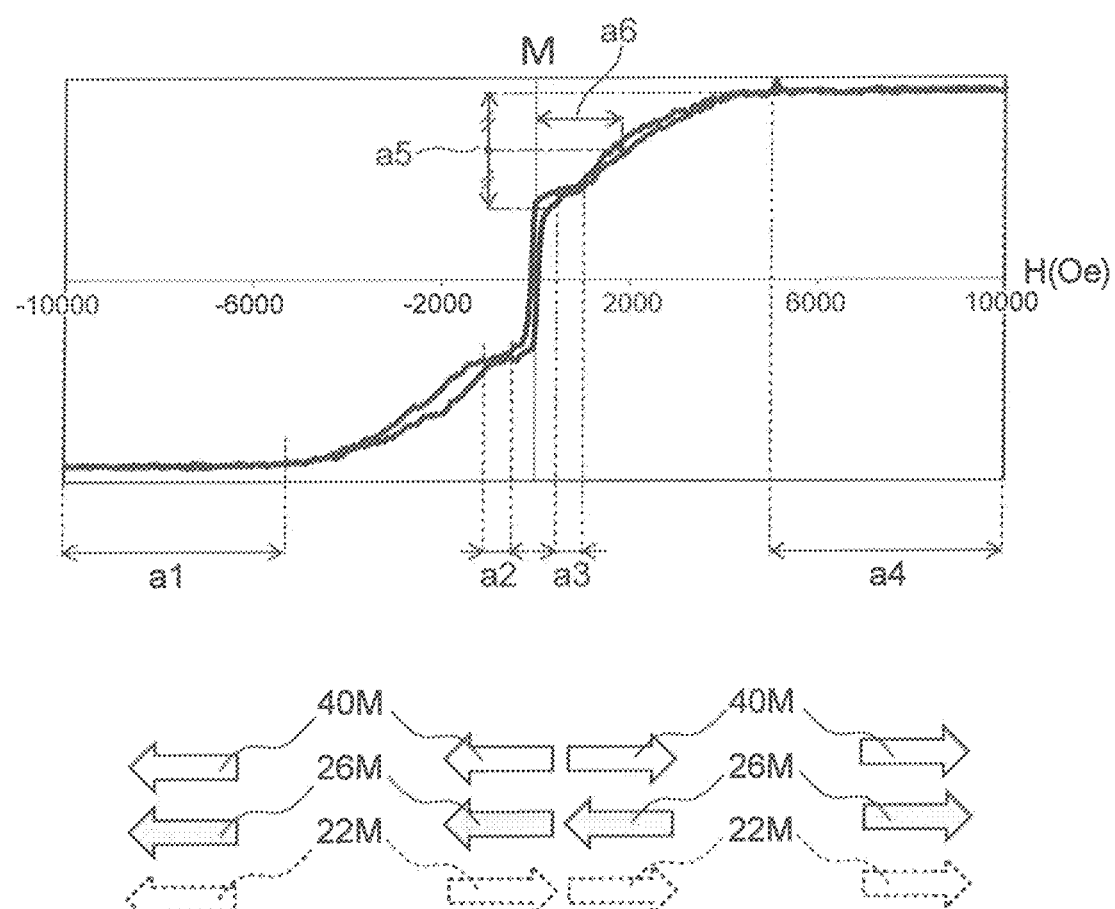
FIG. 3 is the measurement results of the sample subjected to the heat treatment at 320° C.
Figure 4A:
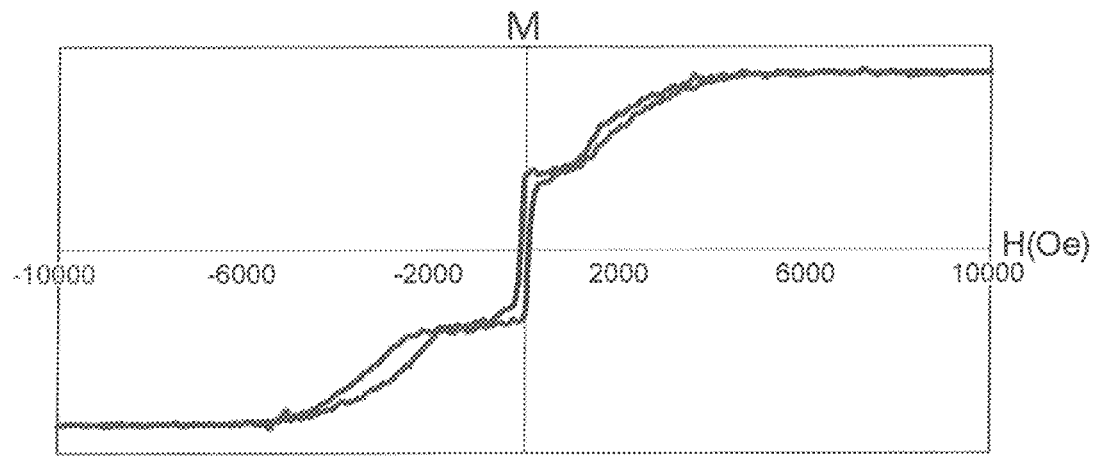
FIG. 4A and FIG. 4B are the measurement results of the samples subjected to the heat treatment at 320° C.
Figure 4B:
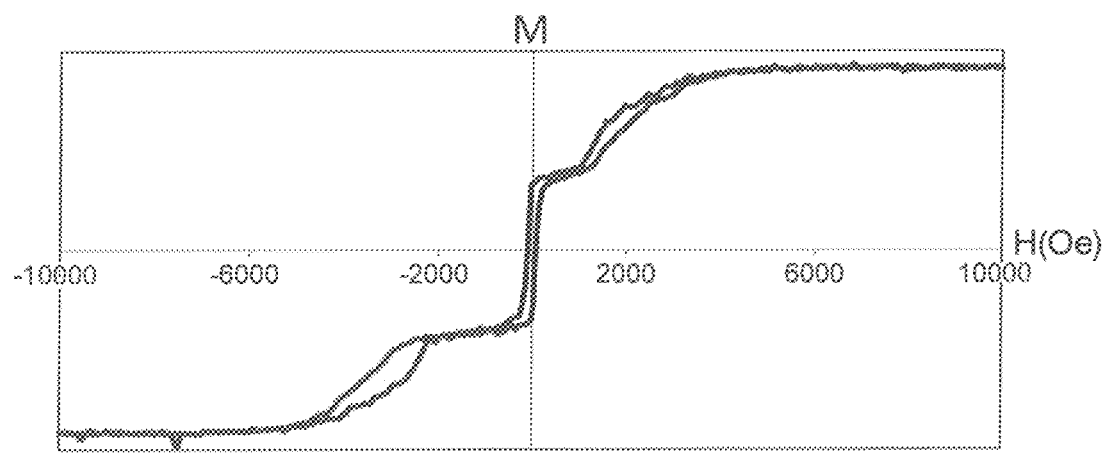

The magnetization characteristics of the first to third samples S01 to S03 after the heat treatment were measured using a vibrating sample magnetometer (VSM). In the VSM measurements, an external magnetic field H was applied; and a magnetic moment M of the samples was determined. One oscillation of the external magnetic field H between +10000 oersteds to −10000 oersteds was performed. The samples were small pieces cut into 10 mm by 10 mm configurations, FIG. 3 is the measurement results of the first sample S01 subjected to the heat treatment at 320° C., FIG. 4A is the measurement results of the second sample S02 subjected to the heat treatment at 320° C. FIG. 4B is the measurement results of the third sample S03 subjected to the heat treatment at 320° C.

In FIG. 3, FIG. 4A, and FIG. 4B, the horizontal axis is the external magnetic field H; and the vertical axis is the magnetic moment M. This is similar for subsequent VSM measurement results as well.

From the measurement results as illustrated in FIG. 3, regions a1, a2, a3, and a4 exist where the change of the magnetic moment M is low as the external magnetic field H changes. An orientation 22M of the magnetization of the fourth magnetic layer 22, an orientation 26M of the magnetization of the second magnetic layer 26, and an orientation 40M of the magnetization of the first magnetic layer 40 are illustrated at the graph lower portion of FIG. 3 in each region. In FIG. 3, the positive orientation of the external magnetic field H is illustrated by a rightward arrow; and the negative orientation of the external magnetic field H is illustrated by a leftward arrow.

The orientations of the magnetizations of the magnetic layers are the same as that of the external magnetic field H for regions a1 and a4. In region a2, only the orientation of the magnetization of the fourth magnetic layer 22 is oriented in the reverse direction of the external magnetic field H. In region a3, only the orientation of the magnetization of the second magnetic layer 26 is oriented in the reverse direction of the external magnetic field H.

The pinning strength of the magnetization of the second magnetic layer 26 was defined as follows; and the magnitude of the pinning strength was evaluated. When the magnetization of the second magnetic layer 26 changes from the antiparallel state to the parallel state with respect to the magnetization of the fourth magnetic layer 22, a change of the magnetic moment having the magnitude illustrated in a5 of FIG. 3 occurs.

The magnitude of the external magnetic field necessary for causing the change of the magnetic moment of half of the magnitude a5 such as the width a6 illustrated in FIG. 3 was defined as Hpin. A large Hpin means that the magnetization of the second magnetic layer 26 does not change easily, and the magnetization pinning strength is strong. When FIG. 3, FIG. 4A, and FIG. 4B are compared, it is found that there is no substantial difference of Hpin among the samples S01 to S03 subjected to the heat treatment at 320° C.

FIG. 5A illustrates the measurement results of the first sample S01 subjected to the heat treatment at 380° C. FIG. 5B illustrates the measurement results of the second sample S02 subjected to the heat treatment at 380° C. FIG. 5C illustrates the measurement results of the third sample S03 subjected to the heat treatment at 380° C.

By comparing FIG. 5A to FIG. 5C, in the third sample S03 compared to the first sample S01 and the second sample S02, it can be seen that Hpin is smaller; and the state of region a4 occurs at a small external magnetic field H.

FIG. 6A illustrates the measurement results of the first sample S01 subjected to the heat treatment at 420° C. FIG. 6B illustrates the measurement results of the second sample S02 subjected to the heat treatment at 420° C. FIG. 6C illustrates the measurement results of the third sample S03 subjected to the heat treatment at 420° C.

By comparing FIG. 6A to FIG. 6C, it can be seen that the width of region a3 is narrower for the second sample S02 than for the first sample S01. It can be seen that there is no region a3 in the third sample S03. This means that the antiparallel coupling of the magnetization of the fourth magnetic layer 22 and the magnetization of the second magnetic layer 26 is damaged by the heat treatment of 420° C.; and the magnetization of the fourth magnetic layer 22 and the magnetization of the second magnetic layer 26 are in the parallel state. In this state, the value of Hpin is zero.

Figure 7:
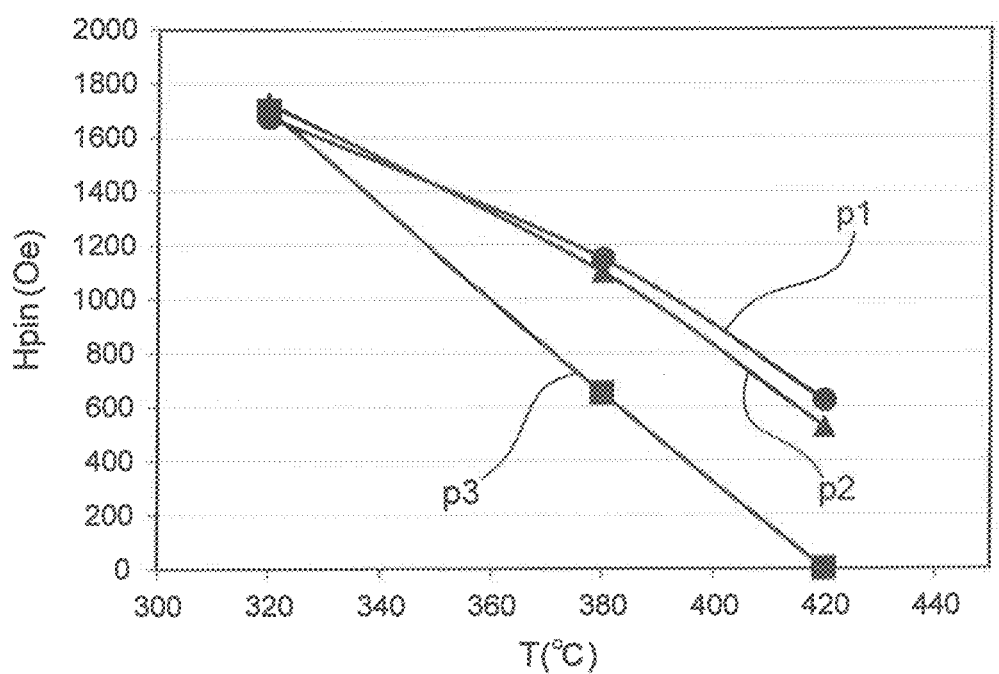
FIG. 7 is the measurement results of Hpin of the samples.

FIG. 7 is the measurement results of Hpin of the samples. Specifically, FIG. 7 illustrates the measurement results of the value of Hpin from the measurement results illustrated in FIG. 3, FIG. 4A, FIG. 4B, FIG. 5A to FIG. 5C, and FIG. 6A to FIG. 6C. In FIG. 7, the horizontal axis is the heat treatment temperature; and the vertical axis is Hpin. Round points p1 illustrate the measurement results of the first sample S01. Triangular points p2 illustrate the measurement results of the second sample S02. Quadrilateral points p3 illustrate the measurement results of the third sample S03.

FIG. 7 illustrates that Hpin decreases as the heat treatment temperature increases for each of the samples. Compared to the third sample S03, it can be seen that the decrease of Hpin is suppressed for the first sample S01 and the second sample S02 which are the magnetic element according to the first embodiment. This result means that the heat resistances of the first sample S01 and the second sample S02 which are the magnetic element according to the first embodiment are higher than the heat resistance of the third sample S03.

FIG. 8A and FIG. 8B are the measurement results of the relationship (the R-H loop) between the resistance and the external magnetic field of the samples. Specifically, FIG. 8A illustrates the measurement results of the first sample S01 subjected to the heat treatment at 420° C.; and FIG. 8B illustrates the measurement results of the third sample S03 subjected to the heat treatment at 380° C. The measurements were performed by making the second electrode 52 on the samples and by patterning into square elements having 20 μm sides.

The orientation 26M of the magnetization of the second magnetic layer 26 and the orientation 40M of the magnetization of the first magnetic layer 40 due to the external magnetic fields are illustrated at the lower portions of FIG. 8A and FIG. 8B. Due to the heat treatment, the orientation 26M of the magnetization of the second magnetic layer 26 is magnetized in the negative orientation of the external magnetic field.

As illustrated in the graphs of FIG. 8A and FIG. 8B, in the state in which the value of the applied magnetic field is smaller than −50 oersteds, the orientation 26M and the orientation 40M are parallel; and the resistances of the samples are small.

As illustrated in FIG. 8A, in the first sample S01, the resistance is maintained substantially at the maximum value even in the state in which the value of the applied magnetic field is larger than +200 oersteds. This result illustrates that the first sample S01 has a sufficient magnetization pinning strength even after the heat treatment at 420° C., and that the state in which the orientation 26M and the orientation 40M are antiparallel is maintained as illustrated in at the lower portion of FIG. 8A.

As illustrated in FIG. 8B, in the third sample S03, the resistance starts to decrease from when the external magnetic field is small in the state in which the external magnetic field has a positive orientation. This result shows that because the third sample S03 does not have a sufficient magnetization pinning strength after the heat treatment at 380° C., the orientation 26M changes due to the external magnetic field; and the state in which the orientation 26M and the orientation 40M are antiparallel cannot be maintained even for a low external magnetic field as illustrated at the lower portion of FIG. 8B. If the orientation 26M changes due to the low external magnetic field and the state in which the orientation 26M and the orientation 40M are antiparallel cannot be maintained, the MR ratio undesirably decreases.

Figure 9:
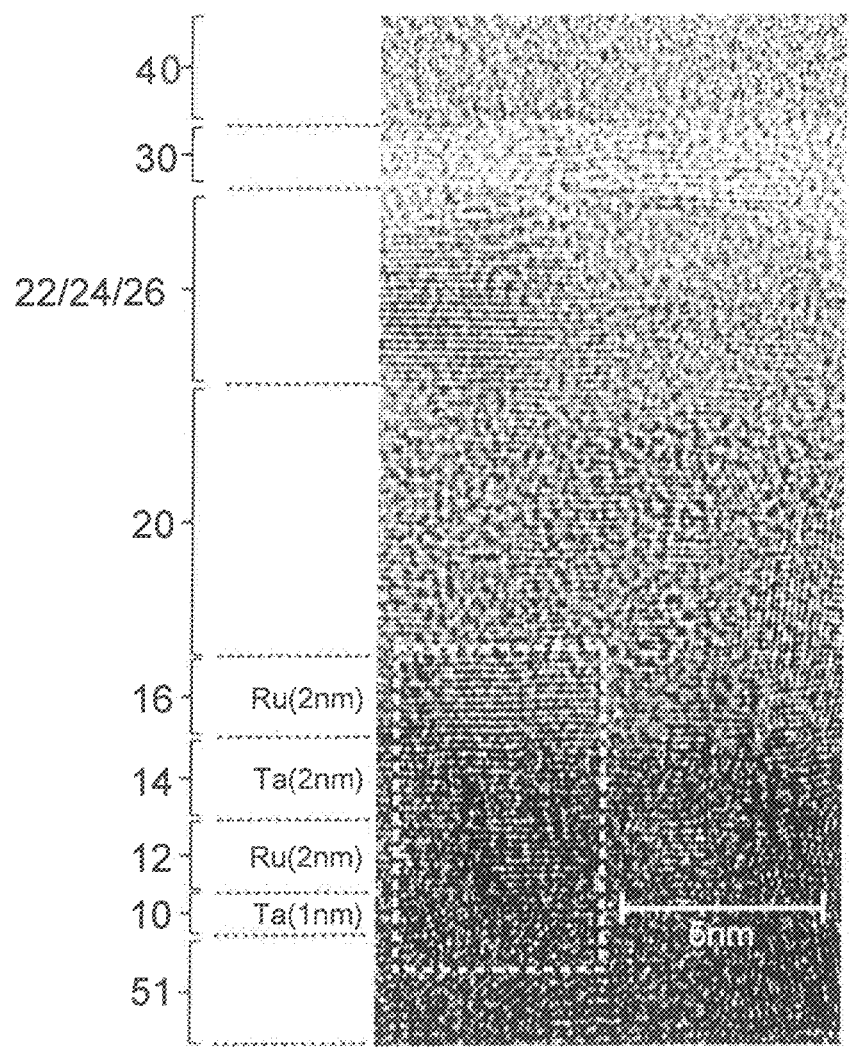
FIG. 9 and FIG. 10 are cross-section transmission electron microscope (cross-section TEM) photographs.
Figure 10:
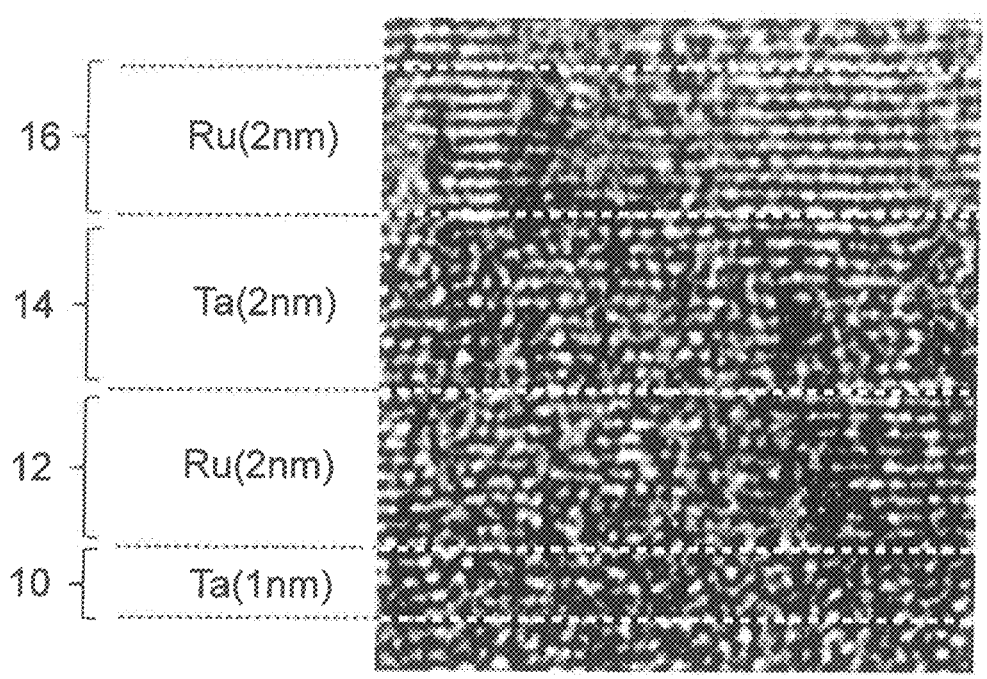

FIG. 9 and FIG. 10 are cross-section transmission electron microscope (cross-section TEM) photographs. FIG. 9 is a photograph of the stacked structure from the first electrode 51 to the first magnetic layer 40 of the first sample S01. FIG. 10 is a photograph in which the region surrounded with the white broken line in FIG. 9 is enlarged. The fourth layer 10, the first layer 12, the second layer 14, and the third layer 16 are illustrated in the photograph of FIG. 10.

It can be seen from FIG. 10 that a crystalline portion is included in both the Ru layer of the first layer 12 and the Ru layer of the third layer 16. A regular order is not observed in the Ta layer of the first electrode 51. Similarly to the first electrode 51, a regular order of atoms is not observed in the Ta layer of the fourth layer 10. The Ta layer of the fourth layer 10 is amorphous; but the Ta layer of the second layer 14 includes a crystalline portion.

From this result, it can be seen that in the first sample S01 and the second sample S02, the third magnetic layer 20 is provided on a Ta layer including a crystalline portion. In the third sample S03, it is considered that the third magnetic layer 20 is provided on an amorphous Ta layer, i.e., the fourth layer 10, with the Ru layer of the first layer 12 interposed.

Based on the photograph of FIG. 10, the lattice plane spacing in the stacking direction (the Z-direction) of the Ta layer of the second layer 14 was measured to be 0.232 nm to 0.234 nm. The lattice plane spacing in the stacking direction of the α-Ta having the (110) orientation was 0.234 nm. Accordingly, it is considered that the Ta layer of the second layer 14 is a α-Ta layer having the (110) orientation.

Then, a fourth sample S04, a fifth sample S05, a sixth sample S06, a seventh sample S07, an eighth sample S08, and a ninth sample S09 were made on a Si substrate; and experiments were performed.

The configuration of the fourth sample S04 is as follows.
Fourth layer 10: Ta (1 nm)
First layer 12: Ru (2 nm)
Second layer 14: Ta (2 nm)
Third layer 16: Ru (2 nm)
Third magnetic layer 20: $Ir_{22}Mn_{78}$ (7 nm)
Capping layer 50: Ta (3 nm)
The configuration from the fourth layer 10 to the third magnetic layer 20 of the fourth sample S04 is similar to the configuration from the fourth layer 10 to the third magnetic layer 20 of the first sample S01.

In the fifth sample S05, 20 nm of $Ir_{22}Mn_{78}$ is provided as the third magnetic layer 20 instead of 7 nm of $Ir_{22}Mn_{78}$. Other than the third magnetic layer 20, the configuration of the fifth sample S05 is similar to that of the fourth sample S04.

The third magnetic layer 20 is not provided in the sixth sample S06. Otherwise, the configuration of the sixth sample S06 is similar to that of the fourth sample S04.

The configuration of the seventh sample S07 is as follows.
Fourth layer 10: Ta (1 nm)
First layer 12: Ru (2 nm)
Third magnetic layer 20: $Ir_{22}Mn_{78}$ (7 nm)
Capping layer 50: Ta (3 nm)
The configuration from the fourth layer 10 to the third magnetic layer 20 of the seventh sample S07 is similar to the configuration from the fourth layer 10 to the third magnetic layer 20 of the third sample S03.

In the eighth sample S08, 20 nm of $Ir_{22}Mn_{78}$ is provided as the third magnetic layer 20 instead of 7 nm of $Ir_{22}Mn_{78}$. Other than the third magnetic layer 20, the configuration of the eighth sample S08 is similar to that of the seventh sample S07.

The third magnetic layer 20 is not provided in the ninth sample S09. Otherwise, the configuration of the ninth sample S09 is similar to that of the seventh sample S07.

In other words, in the fourth to sixth samples S04 to S06, the second layer 14 and the third layer 16 are provided between the first layer 12 and the third magnetic layer 20. In the seventh to ninth samples S07 to S09, the second layer 14 and the third layer 16 are not provided between the first layer 12 and the third magnetic layer 20.

Figure 11A:
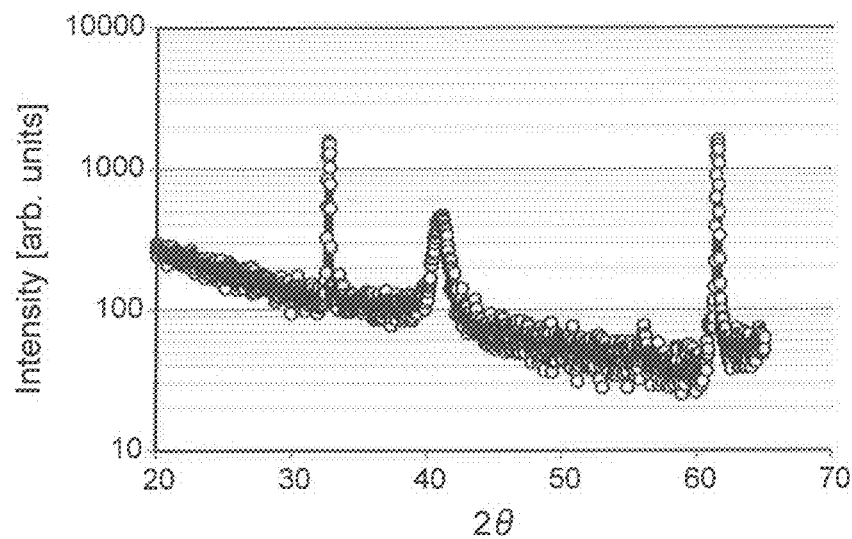
FIG. 11A to FIG. 11C and FIG. 12A to FIG. 12C are the spectra of X-ray analysis measurement results of the samples.
Figure 11B:
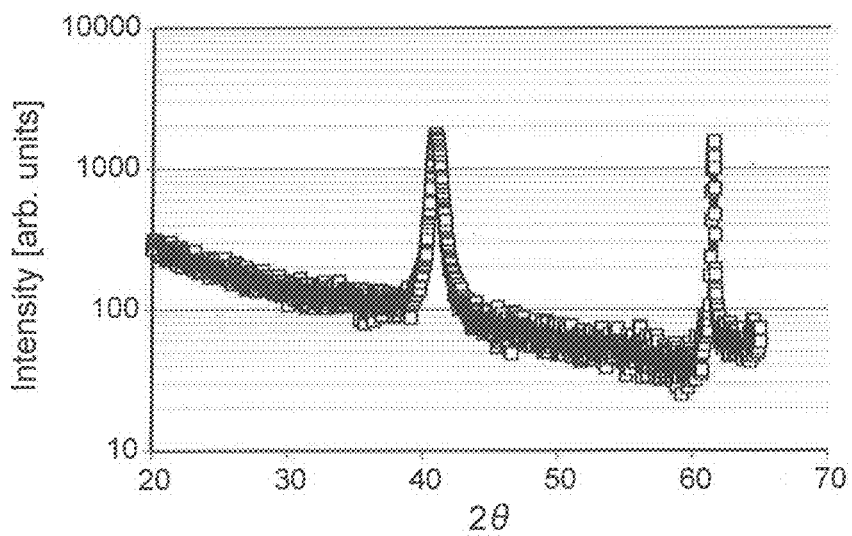
Figure 11C:
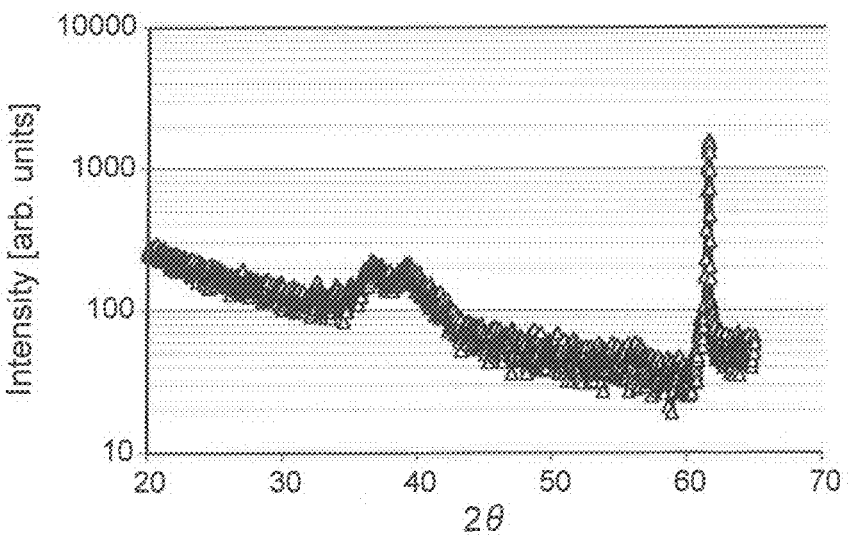
Figure 12A:
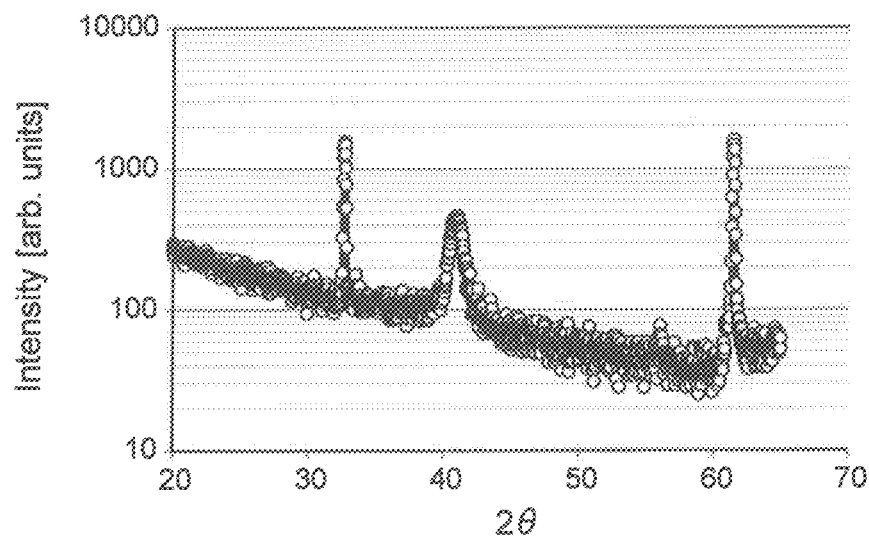
Figure 12B:
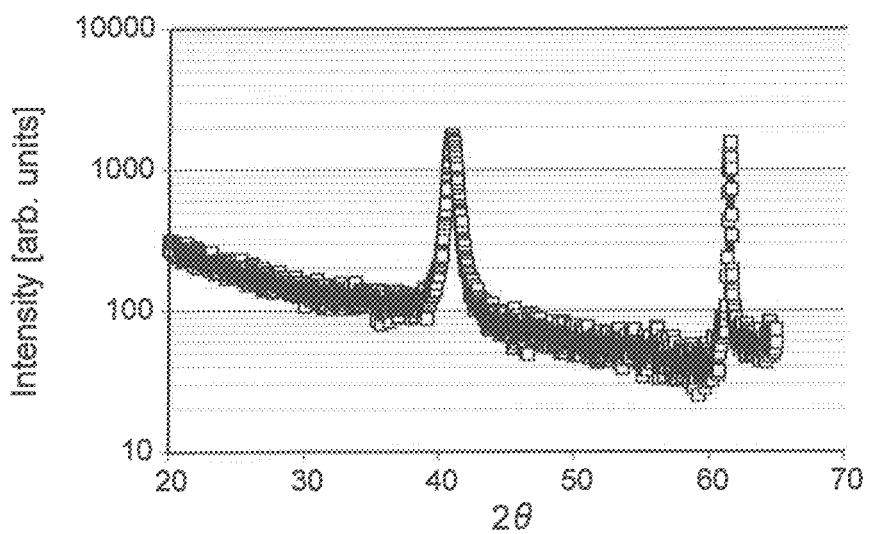
Figure 12C:
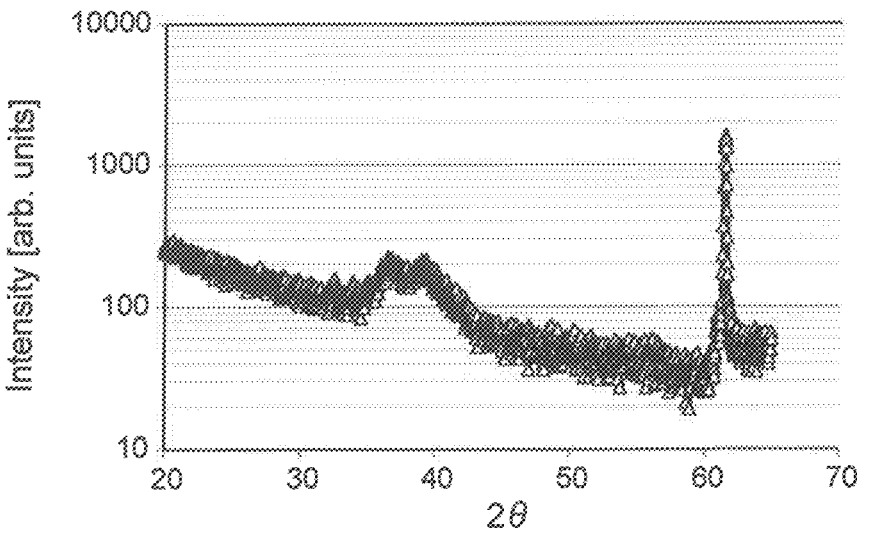

FIG. 11A is the spectrum of X-ray analysis (X-ray diffraction (XRD)) measurement results of the fourth sample S04. FIG. 11B is the spectrum of the XRD measurement results of the fifth sample S05. FIG. 11C is the spectrum of the XRD measurement results of the sixth sample S06. FIG. 12A is the spectrum of the XRD measurement results of the seventh sample S07. FIG. 12B is the spectrum of the XRD measurement results of the eighth sample S08. FIG. 12C is the spectrum of the XRD measurement results of the ninth sample S09.

The measurement results of FIG. 11A to FIG. 11C and FIG. 12A to FIG. 12C are obtained from the fourth to ninth samples S04 to S09 prior to performing heat treatment.

For the experimental conditions according to FIG. 11A to FIG. 11C and FIG. 12A to FIG. 12C, the crystal of the Ir—Mn has the peak structure of the (111) plane at the vicinity of 2θ=41°. From FIG. 11A to FIG. 11C and FIG. 12A to FIG. 12C, it can be seen that a peak structure is not observed at the vicinity of 2θ=41° for the sixth sample S06 and the ninth sample S09 in which the third magnetic layer 20 of $Ir_{22}Mn_{78}$ is not provided.

The peak structure of the $Ir_{22}Mn_{78}$ layer having the thickness of 7 nm can be extracted by subtracting the spectrum of the sixth sample S06 illustrated in FIG. 11C from the spectrum of the fourth sample S04 illustrated in FIG. 11A.

The peak structure of the $Ir_{22}Mn_{78}$ layer having the thickness of 20 nm can be extracted by subtracting the spectrum of the sixth sample S06 illustrated in FIG. 11C from the spectrum of the fifth sample S05 illustrated in FIG. 11B.

Similarly, the peak structure of the $Ir_{22}Mn_{78}$ layer having the thickness of 7 nm can be extracted by subtracting the spectrum of the ninth sample S09 illustrated in FIG. 12C from the spectrum of the seventh sample S07 illustrated in FIG. 12A.

The peak structure of the $Ir_{22}Mn_{78}$ layer having the thickness of 20 nm can be extracted by subtracting the spectrum of the ninth sample S09 illustrated in FIG. 12C from the spectrum of the eighth sample S08 illustrated in FIG. 12B.

Figure 13A:
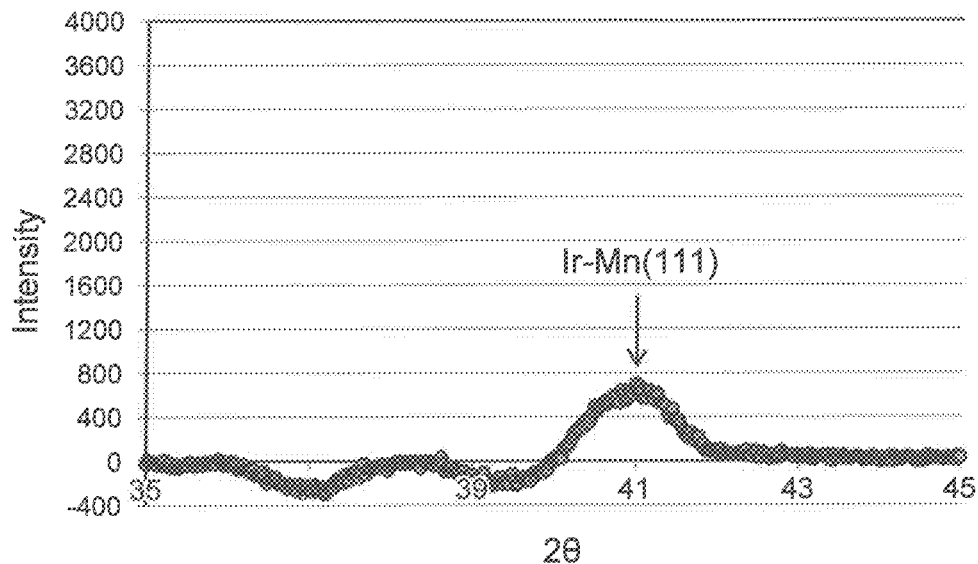
FIG. 13A, FIG. 13B, FIG. 14A, and FIG. 14B are the spectra in which the peak structures of the third magnetic layer are extracted.
Figure 13B:
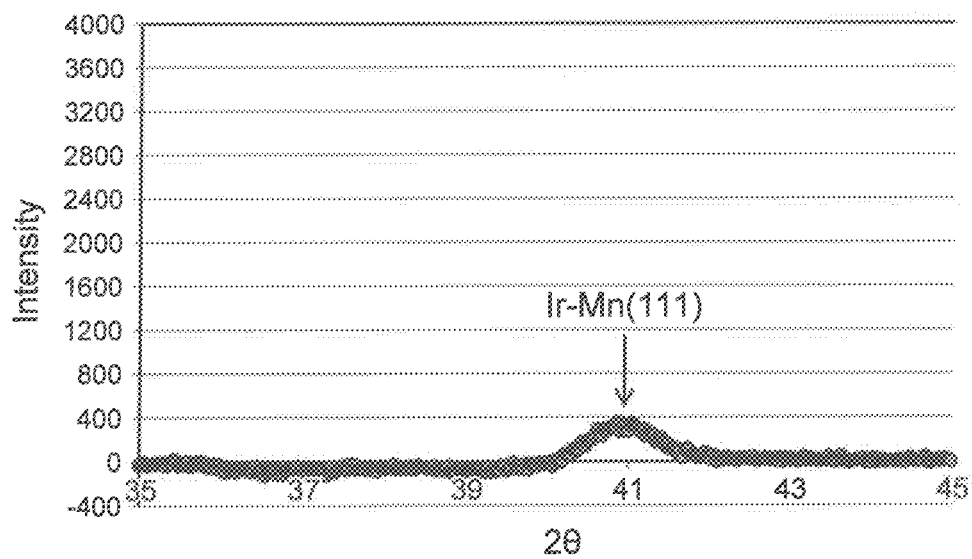

FIG. 13A and FIG. 13B are spectra in which the peak structure of the third magnetic layer 20 is extracted for the fifth sample S04 and the eighth sample S07.

Specifically, FIG. 13A is the spectrum in which the peak structure of the $Ir_{22}Mn_{78}$ layer having the thickness of 7 nm is extracted for the fourth sample S04. FIG. 13B is the spectrum in which the peak structure of the $Ir_{22}Mn_{78}$ layer having the thickness of 7 nm is extracted for the seventh sample S07.

By comparing FIG. 13A and FIG. 13B, it can be seen that the intensity of the peak structure of the (111) plane is stronger for the spectrum of the $Ir_{22}Mn_{78}$ layer of the fourth sample S04 than for the spectrum of the $Ir_{22}Mn_{78}$ layer of the seventh sample S07.

The thickness of the $Ir_{22}Mn_{78}$ layer (the third magnetic layer) of the fourth sample S04 is equal to the thickness of the $Ir_{22}Mn_{78}$ layer of the seventh sample S07. Accordingly, the difference of the spectra means that the crystallinity is higher for the third magnetic layer 20 of the fourth sample S04 than for the third magnetic layer 20 of the seventh sample S07 In the state prior to the heat treatment. In other words, this means that the crystallinity is higher for the third magnetic layer 20 of the fourth sample S04 in which the second layer 14 and the third layer 16 are provided than for the third magnetic layer 20 of the seventh sample S07 in which the second layer 14 and the third layer 16 are not provided.

Figure 14A:
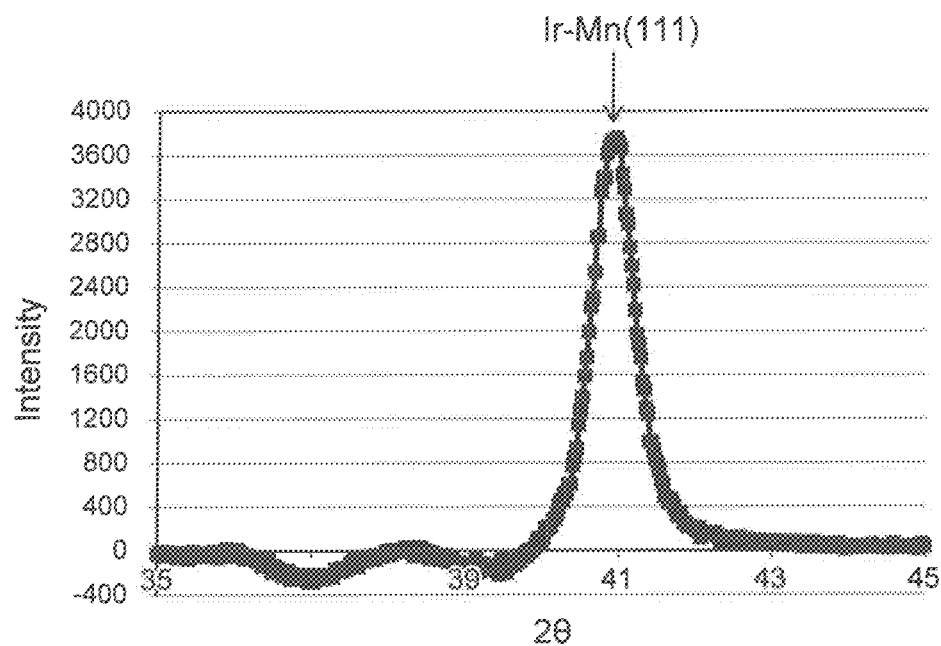
Figure 14B:
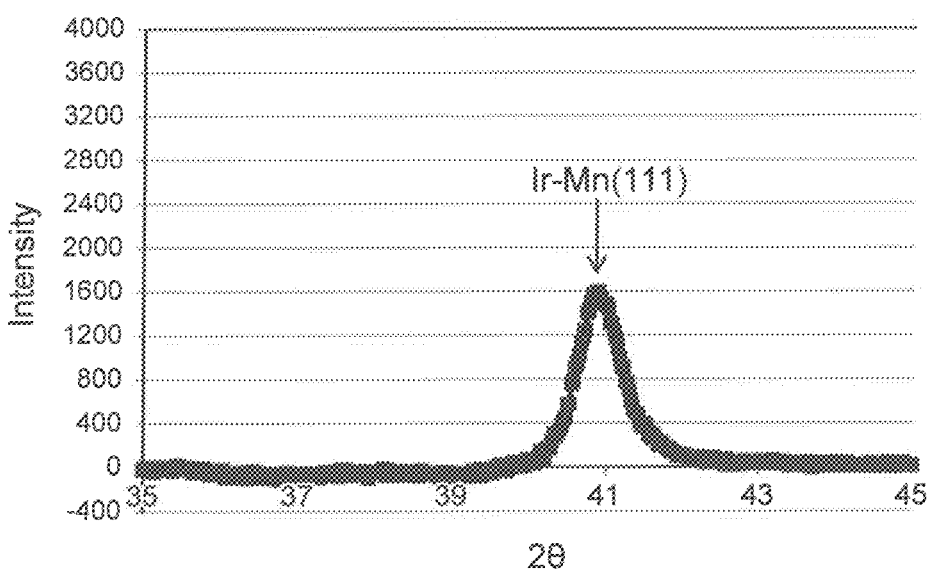

FIG. 14A and FIG. 14B are spectra in which the peak structure of the third magnetic layer 20 is extracted for the fifth sample S05 and the eighth sample S08.

Specifically, FIG. 14A is the spectrum in which the peak structure of the $Ir_{22}Mn_{78}$ layer having the thickness of 20 nm is extracted for the fifth sample S05. FIG. 14B is the spectrum in which the peak structure of the $Ir_{22}Mn_{78}$ layer having the thickness of 20 nm is extracted for the eighth sample S08.

By comparing FIG. 14A and FIG. 14B, it can be seen that the Intensity of the peak structure of the (111) plane is larger for the spectrum of the $Ir_{22}Mn_{78}$ layer of the fifth sample S05 than for the spectrum of the $Ir_{22}Mn_{78}$ layer of the eighth sample S08.

The thickness of the $Ir_{22}Mn_{78}$ layer (the third magnetic layer) of the fifth sample S05 is equal to the thickness of the $Ir_{22}Mn_{78}$ layer of the eighth sample S08, Accordingly, the difference of the spectra means that the crystallinity is higher for the third magnetic layer 20 of the fifth sample S05 than for the third magnetic layer 20 of the eighth sample S08 in the state prior to the heat treatment. In other words, this means that the crystallinity is higher for the third magnetic layer 20 of the fifth sample S05 in which the second layer 14 and the third layer 16 are provided than for the third magnetic layer 20 of the eighth sample S08 in which the second layer 14 and the third layer 16 are not provided.

Then, a tenth sample S10 and an eleventh sample S11 were made; and experiments were performed. In the tenth sample S10, compared to the configuration illustrated in FIG. 2 (the first sample S01), a fourth layer 10a, a first layer 12a, and a second layer 14a are provided Instead of the fourth layer 10, the first layer 12, and the second layer 14. The fourth layer 10a, the first layer 12a, and the second layer 14a are respectively thicker than the fourth layer 10, the first layer 12, and the second layer 14.

The configuration of the tenth sample S10 is as follows.
Fourth layer 10a: Ta (20 nm)
First layer 12a: Ru (20 nm)
Second layer 14a: Ta (20 nm)
Third layer 16a: Ru (2 nm)
Third magnetic layer 20: $Ir_{22}Mn_{78}$ (7 nm)
Fourth magnetic layer 22: $Co_{50}Fe_{50}$ (2.5 nm)
Second nonmagnetic layer 24: Ru (0.9 nm)
Second magnetic layer 26: $Co_{40}Fe_{40}B_{20}$ (3 nm)
First nonmagnetic layer 30: Mg—O (1.8 nm)
First magnetic layer 40: $Co_{40}Fe_{40}B_{20}$ (0.5 nm)/$Fe_{80}B_{20}$ (8 nm)
Capping layer 50: Mg—O (1.5 nm)/Cu (1 nm)/Ta (2 nm)/Ru (200 nm)

The configuration of the eleventh sample S11 is as follows.
Fourth layer 10a: Ta (20 nm)
First layer 12a: Ru (2 nm)
Third magnetic layer 20: $Ir_{22}Mn_{78}$ (7 nm)
Fourth magnetic layer 22: $Co_{50}Fe_{50}$ (2.5 nm)
Second nonmagnetic layer 24: Ru (0.9 nm)
Second magnetic layer 26: $Co_{40}Fe_{40}B_{20}$ (3 nm)
First nonmagnetic layer 30: Mg—O (1.8 nm)
First magnetic layer 40: $Co_{40}Fe_{40}B_{20}$ (0.5 nm)/$Fe_{80}B_{20}$ (8 nm)
Capping layer 50: Mg—O (1.5 nm)/Cu (1 nm)/Ta (2 nm)/Ru (200 nm)

In the eleventh sample S11, compared to the third sample S03, the fourth layer 10a and the first layer 12a are provided instead of the fourth layer 10 and the first layer 12, Other than the fourth layer 10a and the first layer 12a, the configuration of the eleventh sample S11 is similar to that of the third sample S03.

The tenth sample S10 and the eleventh sample S11 are made on the first electrode 51 of Ta (3 nm)/Cu (33 nm)/Ta (20 nm). Each of the samples is a small piece cut into a 10 mm by 10 mm configuration. For each of the samples, beat treatment was performed at 420° C.

FIG. 15A and FIG. 15B are observation results of the tenth sample S10 and the eleventh sample S11.

Specifically, FIG. 15A is obtained by observing the fourth layer 10a, the first layer 12a, and the second layer 14a of the tenth sample S10 using cross-section TEM. FIG. 15B is a photograph obtained by observing the fourth layer 10a of the eleventh sample S11 using cross-section TEM.

From FIG. 15A, it can be seen that the first layer 12a (the 20 nm Ru layer) and the second layer 14a (the 20 nm Ta layer) include crystal portions. On the other hand, it can be seen that the fourth layer 10a (the 20 nm Ta layer) is amorphous and has few crystal portions. This result matches the photograph (FIG. 10) of the fourth layer 10 and the first layer 12 of the first sample S01.

From FIG. 15B, it can be seen that the fourth layer 10a (the 20 nm Ta layer) is amorphous and does not include a crystal portion.

Figure 16:
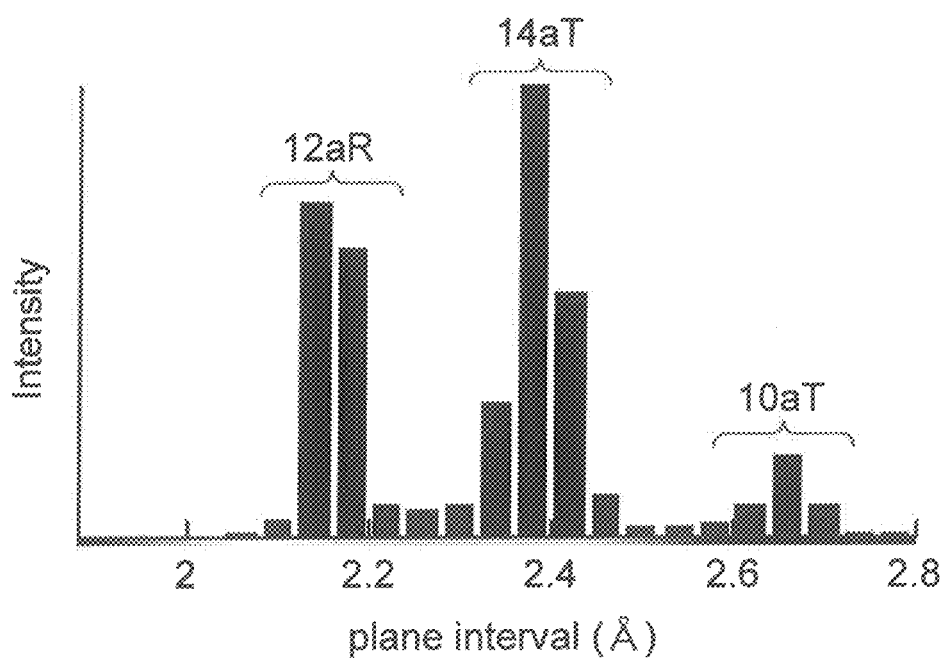
FIG. 16 is the analysis results obtained from the photographs of FIGS. 15A and 15B.

FIG. 16 is the analysis results obtained from the photographs of FIG. 15A. Specifically, FIG. 16 illustrates the results of analyzing the lattice plane spacing in the stacking direction of each layer by performing fast Fourier transform (FFT) mapping of the photographs of FIG. 15A. In FIG. 16, the horizontal axis is the lattice plane spacing in the stacking direction; and the vertical axis is the intensity of the diffraction image. The intensity of the diffraction image increases as the crystallinity increases.

As illustrated in FIG. 16, the first layer 12a (the 20 nm Ru layer) that includes the crystal portion has the peak structure of 12aR, The second layer 14a (the 20 nm Ta layer) that includes the crystal portion has the peak structure of 14aT, The fourth layer 10a (the 20 nm Ta layer) which is amorphous and has few crystal portions has the peak structure of 10aT. In the results of the analysis, similarly to the second layer 14 (the Ta layer) of the first sample S01, the lattice plane spacing in the stacking direction was 0.232 nm to 0.244 nm for the second layer 14a (the 20 nm Ta layer) including the crystal portion. Therefore, it is considered that the Ta included in the second layer 14a is α-Ta having the (110) orientation.

Although not illustrated, it was found from the results of performing FFT mapping analysis of the photograph of FIG. 15B that the fourth layer 10a (the 20 nm Ta layer) which is amorphous and has few crystal portions has a peak structure similar to 10aT of FIG. 16.

Figure 17C:
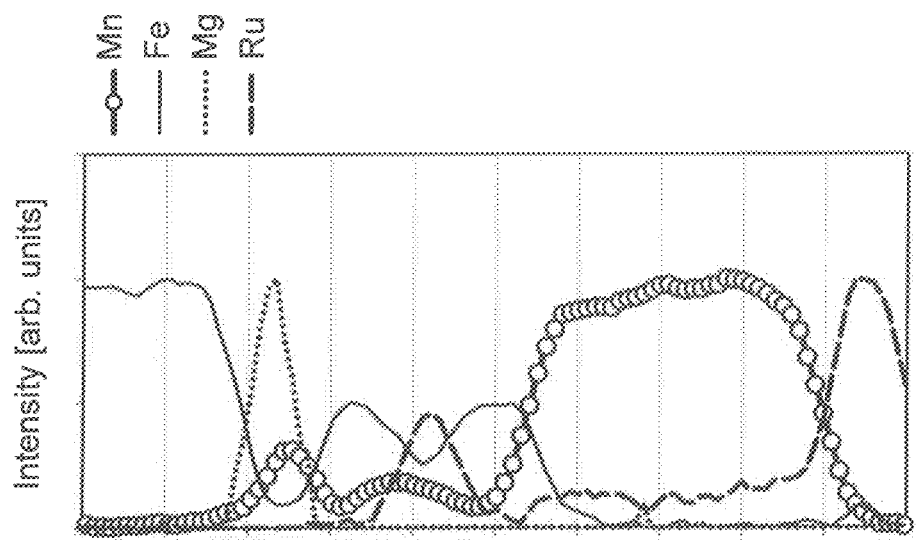
FIG. 17A is a schematic view illustrating a portion of the configuration for the samples and FIGS. 17B and 17C are the results obtained from electron energy loss spectroscopy (EELS) measurements of the samples.
Figure 17B:
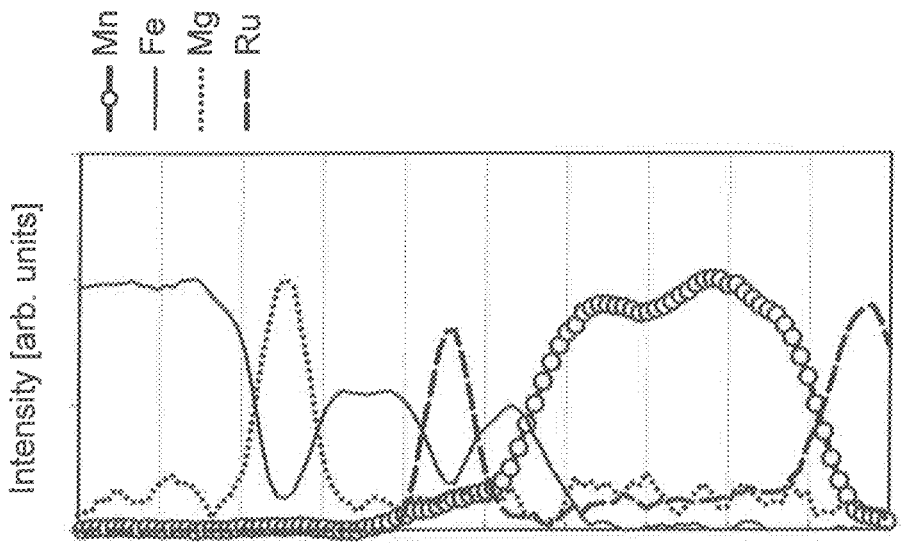
Figure 17A:
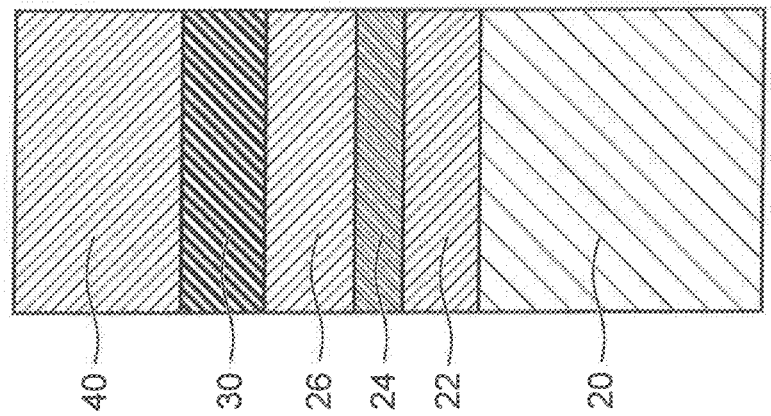

FIG. 17A is a schematic view illustrating a portion of the configuration for the tenth sample S10 and the eleventh sample S11. FIG. 17B is the results obtained from electron energy loss spectroscopy (EELS) measurements of the tenth sample S10. FIG. 17C is the results obtained from EELS of the eleventh sample S11. In the graphs, the vertical axis is the coordinate in the sample interior; and the layers that are positioned at each coordinate are as shown in FIG. 17A. In the graphs, the horizontal axis is the concentration of the atoms.

FIG. 17B and FIG. 17C illustrate the measurement results of the distribution of Mn, Fe, Mg, and Ru for the samples. For easier viewing of the measurement results in FIG. 17B and FIG. 17C, the EELS spectrum of each atoms is normalized using the intensity of the coordinate of the maximum concentration.

In the EELS spectrum of the Mn atoms of the eleventh sample S11 illustrated in FIG. 17C, the peak structure is observed at the vicinity of the third magnetic layer 20, in the region between the second nonmagnetic layer 24 and the second magnetic layer 26, and at the first nonmagnetic layer 30.

In the EELS spectrum of the Mn atoms of the tenth sample S10 illustrated in FIG. 17B, the peak structure is not observed other than at the coordinate of the third magnetic layer 20. This result shows that compared to the eleventh sample S11, the diffusion of Mn after the heat treatment at the high temperature of 420° C. is suppressed in the tenth sample S10.

The relationship of the peak intensity of Mn of each portion will now be described for the EELS measurement results of the eleventh sample S11 in which the diffusion of Mn is observed. When the peak intensity of the EELS spectrum corresponding to the Mn included in the third magnetic layer 20 is set to 1, the peak intensity that corresponds to the Mn included in the region between the second nonmagnetic layer 24 and the second magnetic layer 26 was 0.2. The peak intensity of the spectrum corresponding to the Mn included in the first nonmagnetic layer 30 was 0.32.

The relationship of the intensity of Mn of each portion will now be described for the EELS measurement results of the tenth sample S10 in which the diffusion of Mn is suppressed. When the peak intensity of the EELS spectrum corresponding to the Mn included in the third magnetic layer 20 is set to 1, the intensity of the spectrum corresponding to the Mn included in the second nonmagnetic layer 24 was 0.1 or less. The intensity of the spectrum corresponding to the Mn included in the second magnetic layer 26 was 0.1 or less. The intensity of the spectrum corresponding to the Mn included in the first nonmagnetic layer 30 was 0.04 or less.

Because the decrease of Hpin due to the heat treatment is suppressed by suppressing the diffusion of Mn, the MR ratio of the magnetic element can be increased for the tenth sample S10 by the heat treatment at the high temperature.

The first sample S01 has a configuration that is similar to that of the tenth sample S10 other than the film thicknesses of the fourth layer 10, the first layer 12, and the second layer 14. Also, the crystal structures of the first layer 12 and the second layer 14 of the first sample S01 are similar to the crystal structures of the first layer 12 and the second layer 14 of the tenth sample S10. Accordingly, in the first sample S01 as well, it is estimated that a high MR ratio is obtained by suppressing the diffusion of Mn after the heat treatment.

Figure 18:
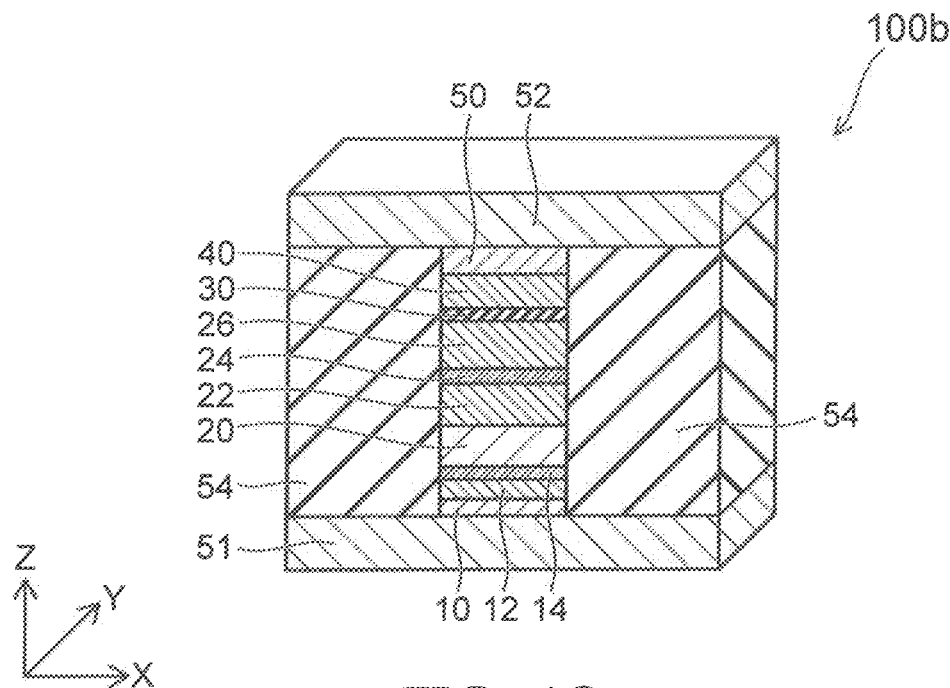
FIG. 18 is a perspective view illustrating another magnetic element according to the first embodiment.

FIG. 18 is a perspective view illustrating another magnetic element according to the first embodiment.

As illustrated in FIG. 18, compared to the magnetic element 100, the magnetic element 100b further includes an insulating layer 54.

The fourth layer 10, the first layer 12, the second layer 14, the third magnetic layer 20, the fourth magnetic layer 22, the second nonmagnetic layer 24, the second magnetic layer 26, the first nonmagnetic layer 30, the first magnetic layer 40, and the capping layer 50 are provided between a portion of the first electrode 51 and a portion of the second electrode 52. The third layer 16 may be provided between the second layer 14 and the third magnetic layer 20. The insulating layer 54 is provided between another portion of the first electrode 51 and another portion of the second electrode 52. The insulating layer 54 overlaps at least the second magnetic layer 26 and the first magnetic layer 40 in the X-direction.

The insulating layer 54 includes, for example, aluminum oxide (e.g., $Al_2O_3$), silicon oxide (e.g., $SiO_2$), etc. The leakage current of the magnetic element 100b is suppressed by the insulating layer 54.

Figure 19:
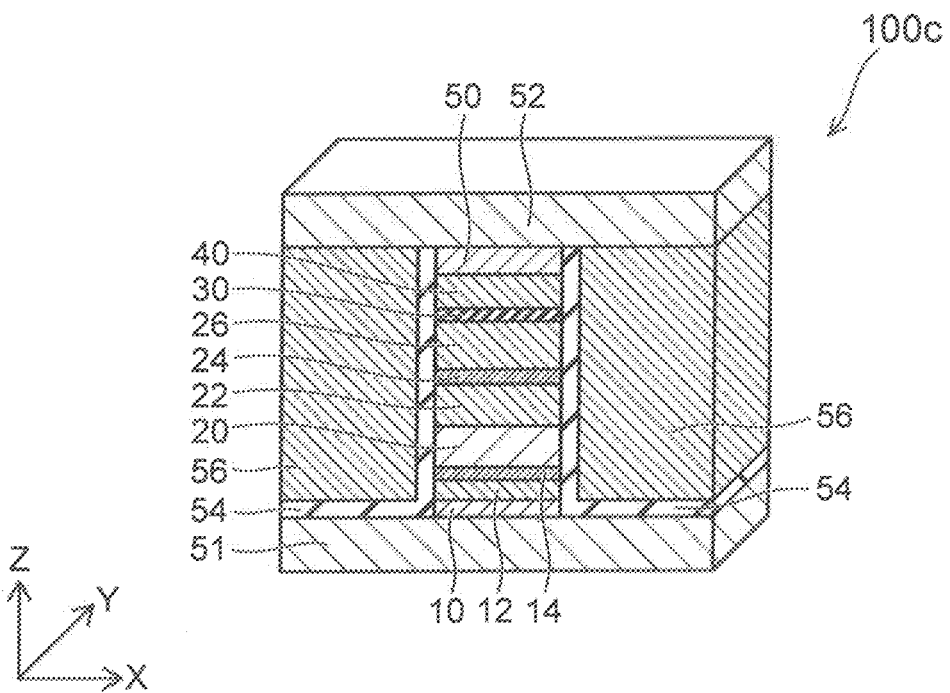
FIG. 19 is a perspective view illustrating another magnetic element according to the first embodiment.

FIG. 19 is a perspective view illustrating another magnetic element according to the first embodiment.

As illustrated in FIG. 19, compared to the magnetic element 100b, the magnetic element 100c further includes a hard bias layer 56.

The fourth layer 10, the first layer 12, the second layer 14, the third magnetic layer 20, the fourth magnetic layer 22, the second nonmagnetic layer 24, the second magnetic layer 26, the first nonmagnetic layer 30, the first magnetic layer 40, and the capping layer 50 are provided between a portion of the first electrode 51 and a portion of the second electrode 52. The third layer 16 may be provided between the second layer 14 and the third magnetic layer 20, The insulating layer 54 and the hard bias layer 56 are provided between another portion of the first electrode 51 and another portion of the second electrode 52.

A portion of the insulating layer 54 is provided between the second magnetic layer 26 and the hard bias layer 56 and between the first magnetic layer 40 and the hard bias layer 56 in the X-direction. Another portion of the insulating layer 54 is provided between the hard bias layer 56 and the other portion of the first electrode 51 in the Z-direction. For example, the hard bias layer 56 is multiply provided in the X-direction. The second magnetic layer 26 and the first magnetic layer 40 are provided between the hard bias layers 56 in the X-direction.

A magnetic field that is generated by the hard bias layer 56 is applied to the second magnetic layer 26 and the first magnetic layer 40. The orientation of the magnetization of the first magnetic layer 40 changes more easily than the orientation of the magnetization of the second magnetic layer 26. Therefore, the orientation of the magnetization of the first magnetic layer 40 is aligned with the orientation of the magnetic field generated by the hard bias layer 56, in the state in which a magnetic field and/or pressure from outside the magnetic element 100c is not transmitted to the magnetic element 100c, the orientation of the magnetization of the first magnetic layer 40 is aligned with the orientation of the magnetic field generated by the hard bias layer 56.

The hard bias layer 56 includes, for example, Co—Pt, Fe—Pt, Co—Pd, Fe—Pd, etc. These materials have, for example, relatively high magnetic anisotropies and coercivities. These materials are, for example, hard magnetic materials. The hard bias layer 56 may include, for example, an alloy in which an added element is further added to Co—Pt, Fe—Pt, Co—Pd, or Fe—Pd.

For example, a CoPt layer, a $(Co_xPt_{100-x})_{100-y}Cr_y$ layer, an FePt layer, etc., may be used as the hard bias layer 56. In the CoPt layer, the proportion of Co is not less than 50 atomic % and not more than 85 atomic %. In the $(Co_xPt_{100-x})_{100-y}Cr_y$ layer, x is not less than 50 atomic % and not more than 85 atomic %; and y is not less than 0 atomic % and not more than 40 atomic %. In the FePt layer, the proportion of Pt is not less than 40 atomic % and not more than 60 atomic %.

In the case where such materials are used, the orientation of the magnetization of the hard bias layer 56 is changed to the direction in which the external magnetic field is applied by applying an external magnetic field that is larger than the coercivity of the hard bias layer 56. The thickness in the Z-direction of the hard bias layer 56 is, for example, not less than 5 nm and not more than 50 nm.

In the case where the insulating layer 54 is provided between the first electrode 51 and the second electrode 52, $SiO_x$ or $AlO_x$ is used as the material of the insulating layer 54. A not-illustrated foundation layer may be further provided between the insulating layer 54 and the hard bias layer 56. In the case where a hard magnetic material such as Co—Pt, Fe—Pt, Co—Pd, Fe—Pd, or the like is used as the hard bias layer 56, Cr, Fe—Co, or the like is used as the material of the foundation layer for the hard bias layer 56.

The hard bias layer 56 may be provided on a not-illustrated antiferromagnetic layer. In such a case, the orientation of the magnetization of the hard bias layer 56 can be set by exchange coupling between the hard bias layer 56 and the antiferromagnetic layer, in such a case, the hard bias layer 56 includes a ferromagnet material of at least one of Fe, Co, or Ni, or an alloy including at least one type of these elements. The hard bias layer 56 includes, for example, a $Co_xFe_{100-x}$ alloy, a $Ni_xFe_{100-x}$ alloy, or a material to which a nonmagnetic element is added to these alloys. In the $Co_xFe_{100-x}$ alloy, x is not less than 0 atomic % and not more than 100 atomic %. In the $Ni_xFe_{100-x}$ alloy, x is not less than 0 atomic % and not more than 100 atomic %.

The hard bias layer 56 may include a material that is similar to the second magnetic layer 26 described above. The antiferromagnetic layer may include a material that is similar to the third magnetic layer 20. In the case where the antiferromagnetic layer is provided, a foundation layer may be provided under the antiferromagnetic layer. The foundation layer may have a stacked structure. For example, materials that are similar to those of the fourth layer 10, the first layer 12, the second layer 14, and the third layer 16 are used respectively as the layers included in the stacked structure. Or, the antiferromagnetic layer may be provided at the upper portion. In such a case, similarly to the third magnetic layer 20, the orientation of the magnetization of the hard bias layer 56 is determined by heat treatment in a magnetic field.

By using the stacked structure of the hard bias layer 56 and the antiferromagnetic layer under the hard bias layer 56, the orientation of the magnetization of the hard bias layer 56 is maintained easily even in the case where a large external magnetic field is applied for a short period of time to the hard bias layer 56.

Figure 20A:
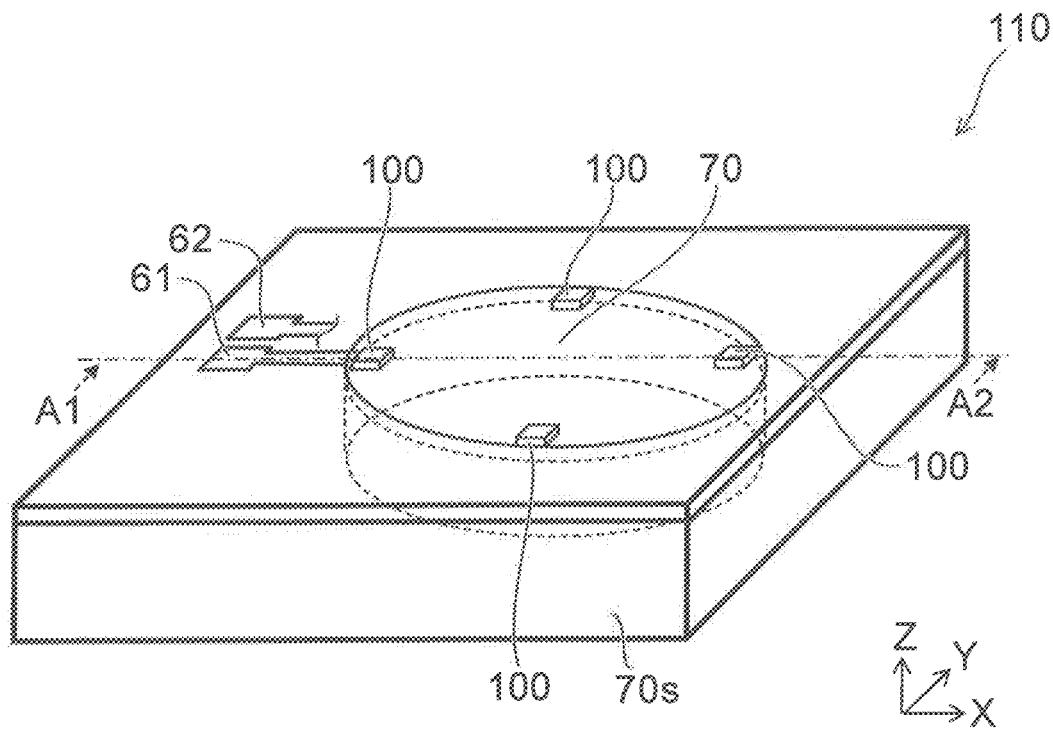
FIG. 20A is a perspective view illustrating a pressure sensor according to a second embodiment and FIG. 20B is a line A1-A2 cross-sectional view of FIG. 20A.
Figure 20B:
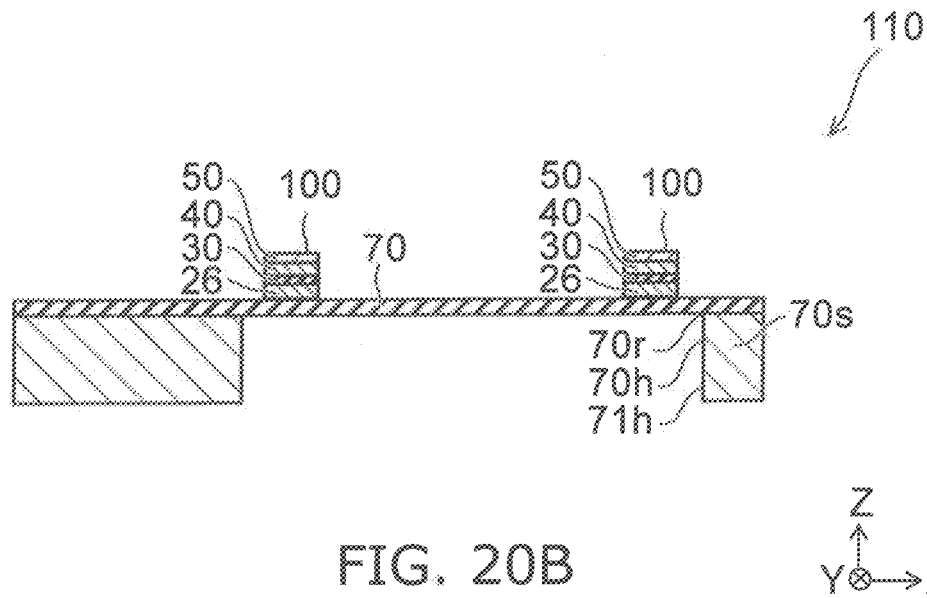

FIG. 20A is a perspective view illustrating a pressure sensor according to a second embodiment. FIG. 20B is a line A1-A2 cross-sectional view of FIG. 20A.

A portion of the configuration of the magnetic element 100 is not illustrated in FIG. 20B.

The pressure sensor 110 includes, for example, the magnetic element 100 illustrated in FIG. 1. The pressure sensor 110 may include the magnetic element 100a illustrated in FIG. 2. As illustrated in FIG. 20A and FIG. 20B, the pressure sensor 110 includes a film portion 70 and the magnetic element 100.

The film portion 70 is supported by, for example, a support portion 70s. The support portion 70s is, for example, a substrate. For example, the film portion 70 has a flexible region. The film portion 70 is, for example, a diaphragm. The film portion 70 may be one body with the support portion 70s or a separate body from the support portion 70s. The same material as the support portion 70s or a material that is different from the support portion 70s may be used as the film portion 70. A portion of the substrate used to form the support portion 70s may be removed; and the portion of the substrate where the thickness is thin may be used to form the film portion 70.

The thickness of the film portion 70 is thinner than the thickness of the support portion 70s. In the case where the same material is used as the film portion 70 and the support portion 70s and the film portion 70 and the support portion 70s are one body, the portion where the thickness is thin is used to form the film portion 70; and the thick portion is used to form the support portion 70s.

The support portion 70s has a through-hole 70h piercing the support portion 70s in the thickness direction; and the film portion 70 may foe provided to cover the through-hole 70h. In such a case, for example, there are cases where the film of the material used to form the film portion 70 extends also on a portion of the support portion 70s other than the through-hole 70h. In such a case, the portion of the film of the material used to form the film portion 70 that overlaps the through-hole 70h is used to form the film portion 70.

The film portion 70 has an outer edge 70r. In the case where the same material is used as the film portion 70 and the support portion 70s and the film portion 70 and the support portion 70s are one body, the outer edge of the portion where the thickness is thin is used to form the outer edge 70r of the film portion 70. In the case where the support portion 70s has the through-hole 70h piercing the support portion 70s in the thickness direction and the film portion 70 is provided to cover the through-hole 70h, the outer edge of the portion of the film of the material used to form the film portion 70 that overlaps the through-hole 70h is used to form the outer edge 70r of the film portion 70.

The support portion 70s may continuously support the outer edge 70r of the film portion 70 or may support a portion of the outer edge 70r of the film portion 70.

The magnetic element 100 is provided on the film portion 70. For example, the magnetic element 100 is provided on a portion of the film portion 70. In the example, the multiple magnetic elements 100 are provided on the film portion 70. The number of magnetic elements provided on the film portion may be one.

In the magnetic element 100 as illustrated in FIG. 20B, for example, the first nonmagnetic layer 30 is provided between the first magnetic layer 40 and the film portion 70. The second magnetic layer 26 is provided between the first nonmagnetic layer 30 and the film portion 70. For example, the fourth layer 10, the first layer 12, the second layer 14, the third layer 16, the third magnetic layer 20, the fourth magnetic layer 22, and the second nonmagnetic layer 24 which are not illustrated in FIG. 20B are provided between the second magnetic layer 26 and the film portion 70.

A first interconnect 61 and a second interconnect 62 are provided in the example. The first interconnect 61 is connected to the magnetic element 100. The second interconnect 62 is connected to the magnetic element 100. For example, an inter-layer insulating film is provided between the first interconnect 61 and the second interconnect 62; and the first interconnect 61 and the second interconnect 62 are electrically insulated from each other.

A voltage is applied between the first interconnect 61 and the second interconnect 62; and the voltage is applied to the magnetic element 100 via the first interconnect 61 and the second interconnect 62. The film portion 70 deforms when pressure is applied to the pressure sensor 110. In the magnetic element 100, the first magnetic layer 40 distorts according to the deformation of the film portion 70. The electrical resistance of the magnetic element 100 changes according to the distortion of the first magnetic layer 40. The pressure can be sensed by sensing the change of the electrical resistance via the first interconnect 61 and the second interconnect 62. In other words, in the pressure sensor 110, the magnetic element 100 functions as a strain sensing element. The change of the resistance recited above is based on, for example, an inverse magnetostrictive effect and a magnetoresistance effect. For example, the relative relationship (e.g., the angle) between the orientation of the magnetization of the first magnetic layer 40 and the orientation of the magnetization of the second magnetic layer 26 changes according to the deformation of the film portion 70. The change of the relative relationship is based on the inverse magnetostrictive effect. The electrical resistance of the magnetic element 100 changes based on the change of the relative relationship. The change of the electrical resistance is based on the magnetoresistance effect.

The support portion 70s may include, for example, a substrate having a plate configuration. For example, a hollow portion 71h (the through-hole 70h) is provided in the interior of the substrate.

The support portion 70s may include, for example, a semiconductor material such as silicon, etc., a conductive material such as a metal, etc., or an insulating material. The support portion 70s may include, for example, silicon oxide, silicon nitride, etc. The interior of the hollow portion 71h is in, for example, a reduced-pressure state (a vacuum state). A gas such as air, etc., or a liquid may be filled into the interior of the hollow portion 71h. The interior of the hollow portion 71h is designed so that the film portion 70 can flex. The interior of the hollow portion 71h may communicate with the outside ambient air.

The film portion 70 is provided on the hollow portion 71h. The film portion 70 includes, for example, a portion of the substrate used to form the support portion 70s that is patterned to be thin. The thickness (the length in the Z-axis direction) of the film portion 70 is thinner than the thickness (the length in the Z-axis direction) of the substrate.

The film portion 70 deforms when pressure is applied to the film portion 70. The pressure corresponds to the pressure to be sensed by the pressure sensor 110. The pressure that is applied includes pressure due to a sound wave, an ultrasonic wave, etc. In the case where pressure due to a sound wave, an ultrasonic wave, or the like is sensed, the pressure sensor 110 functions as a microphone.

The film portion 70 includes, for example, an insulating material. The film portion 70 includes, for example, at least one of silicon oxide, silicon nitride, or silicon oxynitride. The film portion 70 may include, for example, a semiconductor material such as silicon, etc. The film portion 70 may include, for example, a metal material.

The thickness of the film portion 70 is, for example, not less than 0.1 micrometers (μm) and not more than 3 μm. It is favorable for the thickness to be not less than 0.2 μm and not more than 1.5 μm. The film portion 70 may include, for example, a stacked body of a silicon oxide film having a thickness of 0.2 μm and a silicon film having a thickness of 0.4 μm.

The magnetic element 100 may be multiply provided as strain sensing elements on the film portion 70. The equivalent change of the electrical resistance for the pressure can be obtained by the multiple magnetic elements 100. As described below, the SN ratio can be increased by connecting the multiple magnetic elements 100 in series and in parallel.

The size of the magnetic element 100 may be extremely small. The surface area of the magnetic element 100 may be sufficiently less than the surface area of the film portion 70 deforming due to the pressure. For example, the surface area of the magnetic element 100 may be not more than ⅕ of the surface area of the film portion 70.

For example, in the case where the diameter of the film portion 70 is about 60 μm, the dimension of the magnetic element 100 may be 12 μm or less. For example, in the case where the diameter of the film portion 70 is about 600 μm, the dimension of the magnetic element 100 may be 120 μm or less. Considering the patterning precision of the magnetic element 100, etc., it is unnecessary to set the dimension of the magnetic element 100 to be excessively small. Therefore, the dimension of the magnetic element 100 may be, for example, not less than 0.05 μm and not more than 60 μm.

Figure 21:
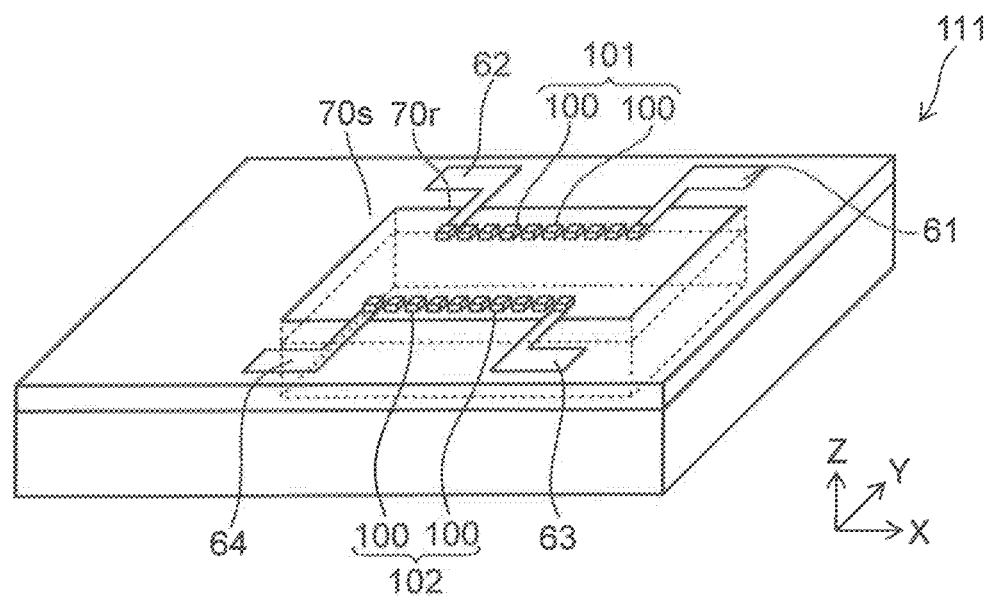
FIG. 21 is a perspective view illustrating another pressure sensor according to the second embodiment.

FIG. 21 is a perspective view illustrating another pressure sensor according to the second embodiment.

While the film portion 70 is a circle in the pressure sensor 110 illustrated in FIG. 20A and FIG. 20B, the film portion 70 is a quadrilateral in the pressure sensor 111 illustrated in FIG. 21.

For example, a first sense portion 101 that includes multiple magnetic elements 100, and a second sense portion 102 that includes other multiple magnetic elements 100 are provided on the film portion 70. The multiple magnetic elements 100 that are included in the first sense portion 101 are arranged along one side of the quadrilateral. The multiple magnetic elements 100 that are included in the second sense portion 102 are arranged along another side opposing the one side.

The magnetic elements 100 that are included in the first sense portion 101 are connected in series between, for example, the interconnects 61 and 62. The magnetic elements 100 that are included in the second sense portion 102 are connected in series between, for example, interconnects 63 and 64. The number of the magnetic elements 100 included in the first sense portion 101 is arbitrary. The number of the magnetic elements 100 included in the second sense portion 102 also is arbitrary.

The cases where the film portion 70 is a circle or a quadrilateral are illustrated in FIG. 20A and FIG. 20B and FIG. 21. However, the configuration of the film portion 70 is not limited to these examples. The planar configuration of the film portion 70 may be, for example, an ellipse (e.g., a flattened circle), another polygon, or another regular polygon.

Figure 22:
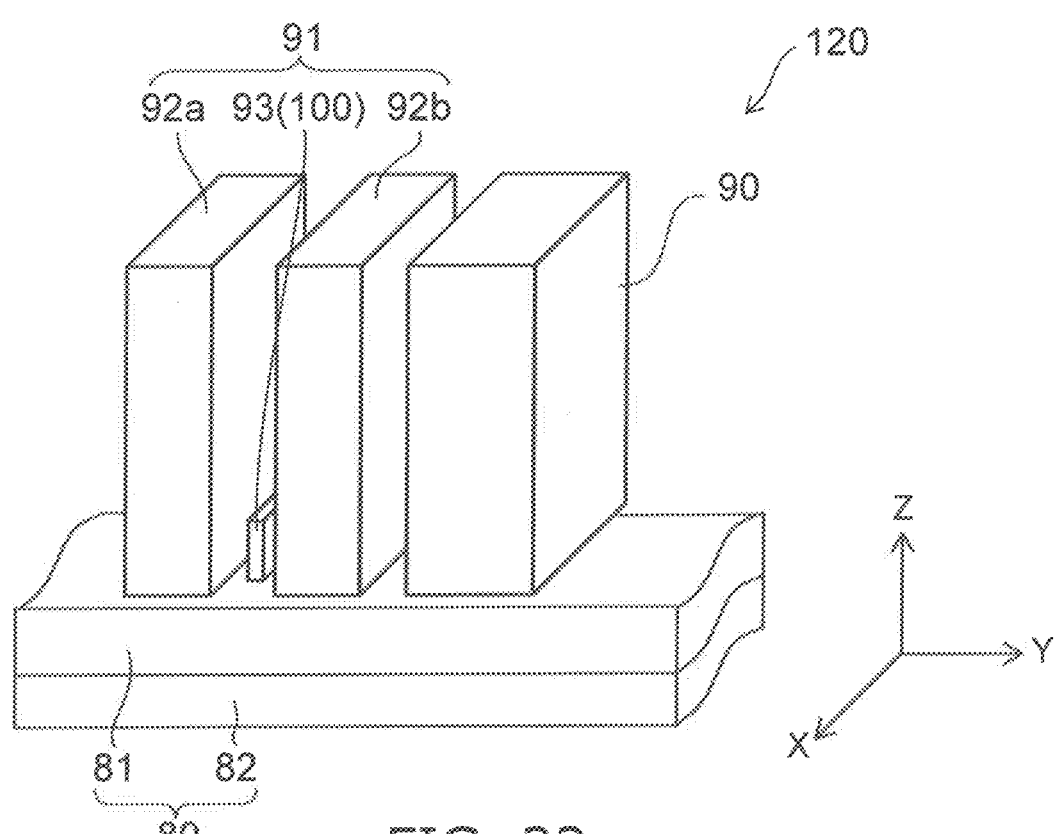
FIG. 22 is a schematic perspective view illustrating a portion of a magnetic head according to a third embodiment.

FIG. 22 is a schematic perspective view illustrating a portion of a magnetic head according to a third embodiment.

The magnetic head 120 includes, for example, the magnetic element 100 illustrated in FIG. 1. The magnetic head 120 may include the magnetic element 100a illustrated in FIG. 2. As illustrated in FIG. 22, the magnetic head 120 is provided to oppose a magnetic recording medium 80. The magnetic recording medium 80 includes a magnetic recording layer 81 and a lining layer 82. The magnetic recording layer 81 opposes the magnetic head 120.

The magnetic head 120 includes a write head portion 90 that opposes the magnetic recording medium 80, and a reproducing head portion 91 that opposes the magnetic recording medium 80 and is provided together with the write head portion 90.

However, in the magnetic head 120, it is sufficient for the reproducing head portion 91 to be provided; the write head portion 90 is omissible; and the write head portion 90 is provided as necessary. The case will now be described where the magnetic head 120 includes the write head portion 90.

The reproducing head portion 91 includes a first magnetic shield layer 92a, a second magnetic shield layer 92b, and a magnetic reproducing element 93 provided between the first magnetic shield layer 92a and the second magnetic shield layer 92b. The magnetic element 100 illustrated in FIG. 1 is used as the magnetic reproducing element 93. The magnetic element 100a illustrated in FIG. 2 may be used as the magnetic reproducing element 93.

The magnetic reproducing element 93 reproduces the recorded information that is recorded in the magnetic recording medium 80 by reproducing the direction of the magnetization of the magnetic recording layer 81.

A direction perpendicular to the surface of the magnetic recording layer 81 opposing the magnetic head 120 is taken as a Z-axis direction. One direction perpendicular to the Z-axis direction is taken as an X-axis direction. A direction perpendicular to the Z-axis direction and the X-axis direction is taken as a Y-axis direction. As described below, for example, the magnetic recording medium 80 may have a disc configuration; and the relative position of the magnetic recording medium 80 and the magnetic head 120 may be changed along the circumference of the magnetic recording medium 80. The X-Y-Z coordinate system recited above may be defined in the range of a short distance at the vicinity of the magnetic head 120.

For example, the magnetic recording medium 80 moves relative to the magnetic head 120 along a direction perpendicular to the Z-axis direction. Magnetic recording is performed by the magnetic head 120 by controlling the magnetization of each position of the magnetic recording layer 81 of the magnetic recording medium 80. The medium movement direction of the magnetic recording medium 80 is taken to be, for example, the Y-axis direction. The relative movement between the magnetic recording medium 80 and the magnetic head 120 may be performed by the movement of the magnetic head 120; and it is sufficient for the magnetic recording medium 80 and the magnetic head 120 to move relatively along the direction perpendicular to the Z-axis direction.

The magnetic head 120 is provided in a head slider 121 described below; and the magnetic head 120 is held to be separated from the magnetic recording medium 80 by the function of the head slider 121. The sensing resolution of the magnetic head 120 can be regulated by providing a not-illustrated magnetic shield at the periphery of the magnetic element 100.

Figure 23:
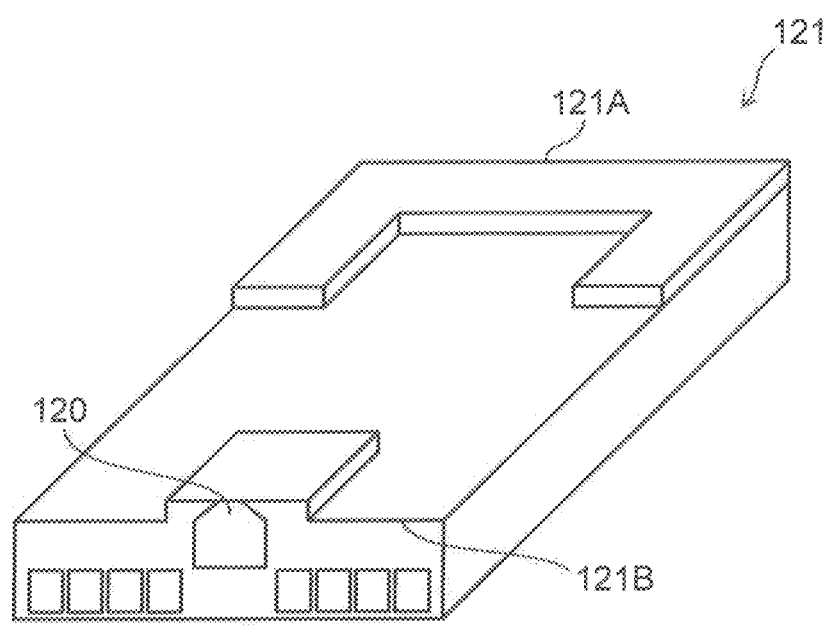
FIG. 23 is a schematic perspective view illustrating a portion of a magnetic recording and reproducing device including the magnetic bead according to the third embodiment.

FIG. 23 is a schematic perspective view illustrating a portion of a magnetic recording and reproducing device including the magnetic head according to the third embodiment.

FIG. 23 illustrates a configuration of a head slider which is a portion of the magnetic recording and reproducing device.

As illustrated in FIG. 23, the magnetic head 120 is provided in the head slider 121. The head slider 121 includes $Al_2O_3$, TiC, etc., and is designed and made to be able to move relative to a magnetic recording medium 80 such as a magnetic disk, etc., while flying over or contacting the magnetic recording medium 80.

The head slider 121 has, for example, an air inflow side 121A and an air outflow side 121B; and the magnetic head 120 is disposed at the side surface of the air outflow side 121B or the like. Thereby, the magnetic head 120 that is provided in the head slider 121 moves relative to the magnetic recording medium 80 while flying over or contacting the magnetic recording medium 80.

A magnetic recording and reproducing device 250 is described as an example of the configuration of the entire magnetic recording and reproducing device including the magnetic head according to the third embodiment.

Figure 24:
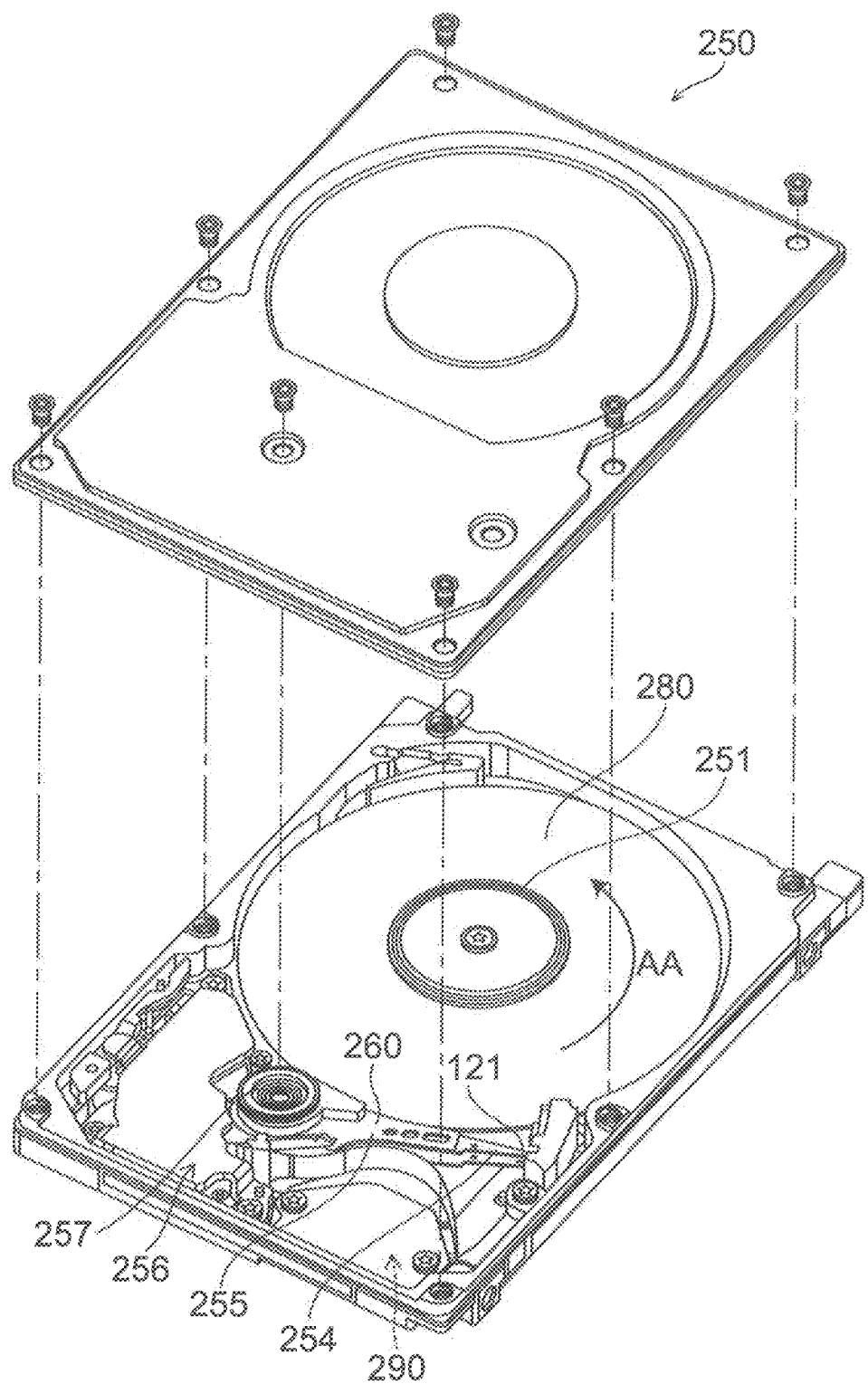
FIG. 24 is a schematic perspective view illustrating the configuration of the magnetic recording and reproducing device.

FIG. 24 is a schematic perspective view illustrating the configuration of the magnetic recording and reproducing device.

Figure 25A:
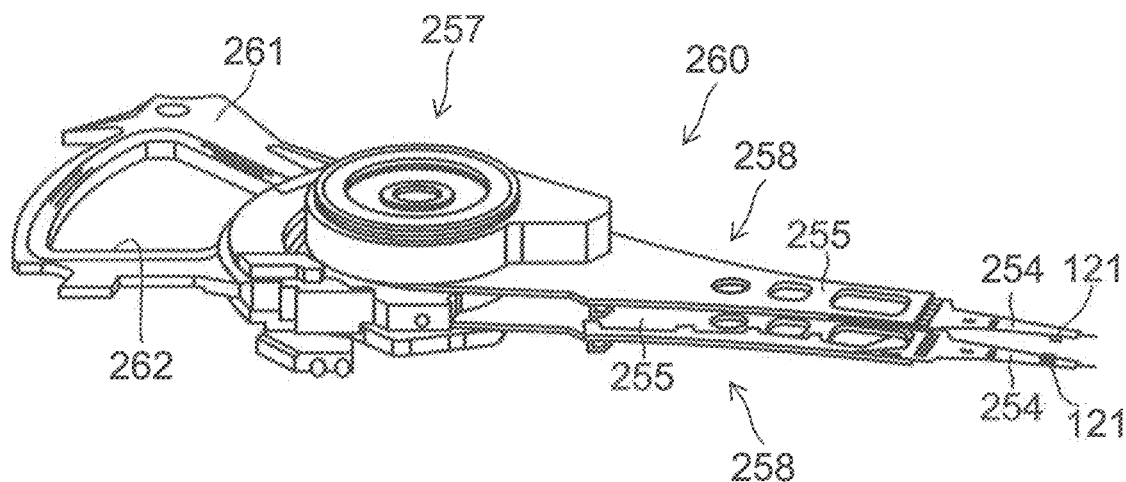
FIG. 25A and FIG. 25B are schematic perspective views illustrating the configuration of a portion of the magnetic recording and reproducing device.
Figure 25B:
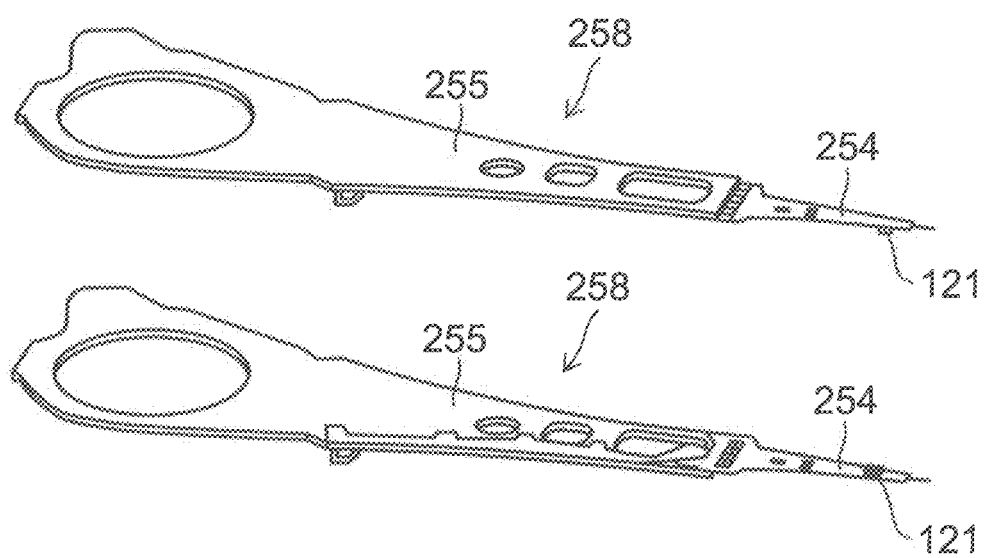

FIG. 25A and FIG. 25B are schematic perspective views illustrating the configuration of a portion of the magnetic recording and reproducing device.

FIG. 25A shows an enlargement of a head stack assembly 260 included in the magnetic recording and reproducing device 250.

FIG. 25B illustrates a magnetic head assembly (a head gimbal assembly 258) which is a portion of the head stack assembly 260.

As illustrated in FIG. 24, the magnetic recording and reproducing device 250 is a device that uses a rotary actuator. A recording medium disk 280 is mounted to a spindle motor 251 and is rotated in the direction of arrow AA by a not-illustrated motor that responds to a control signal from a not-illustrated drive device controller. The magnetic recording and reproducing device 250 may include multiple recording medium disks 280.

The head slider 121 that performs the recording and reproducing of the information stored in the recording medium disk 230 is mounted to the tip of a suspension 254 having a thin-film configuration.

When the recording medium disk 280 rotates, the medium-opposing surface of the head slider 121 is held at a prescribed fly height from the surface of the recording medium disk 280 by the balance between downward pressure due to the suspension 254 and the pressure generated by the medium-opposing surface of the bead slider 121. So-called "contact-sliding" may be used in which the head slider 121 contacts the recording medium disk 280.

The suspension 254 is connected to one end of an actuator arm 255 that includes a bobbin part holding a not-illustrated drive coil, etc. A voice coil motor 256 which is one type of linear motor is provided at the other end of the actuator arm 255. The voice coil motor 256 includes the not-illustrated drive coil that is wound onto the bobbin part of the actuator arm 255, and a magnetic circuit made of a permanent magnet and an opposing yoke that are disposed to oppose each other with the coil interposed.

The actuator arm 255 is held by not-illustrated ball bearings provided at two locations on and under a bearing part 257; and the actuator arm 255 can be caused to rotate and slide unrestrictedly by the voice coil motor 256. As a result, the magnetic bead 120 is movable to any position of the recording medium disk 280.

As illustrated in FIG. 25A, the head stack assembly 260 includes the bearing part 257, a head gimbal assembly 258, and a support frame 261. The head gimbal assembly 258 extends from the bearing part 257. The support frame 261 extends in the reverse direction of the head gimbal assembly 258 from the bearing part 257. The support frame 261 supports a coil 262 of the voice coil motor.

As illustrated in FIG. 25B, the head gimbal assembly 258 includes the actuator arm 255 that extends from the bearing part 257, and the suspension 254 that extends from the actuator arm 255. The head slider 121 is mounted to the tip of the suspension 254.

Although two head gimbal assemblies 258 are provided in this specific example, the number of the head gimbal assemblies 258 may be one.

Thus, the magnetic head assembly (the head gimbal assembly 258) includes the magnetic head 120, the head slider 121 in which the magnetic head 120 is provided, the suspension 254, and the actuator arm 255. The head slider 121 is provided at one end of the suspension 254. The actuator arm 255 is connected to the other end of the suspension 254. For example, the magnetic head assembly (the bead gimbal assembly 258) includes the suspension 254 to which the magnetic element 100 is mounted at one end, and the actuator arm 255 that is connected to the other end of the suspension 254.

The suspension 254 includes lead wires (not illustrated) that are for writing and reproducing signals, for a heater that adjusts the fly height, etc.; and the lead wires are electrically connected to electrodes of the magnetic head 120 embedded in the head slider 121.

As illustrated in FIG. 24, a signal processor 290 is provided to write and reproduce the signals to and from the magnetic recording medium 80 by using the magnetic head 120. For example, the signal processor 290 is provided on the backside of the drawing of the magnetic recording and reproducing device 250 illustrated in FIG. 24. The input/output lines of the signal processor 290 are electrically connected to the magnetic head by being connected to electrode pads of the head gimbal assembly 258.

In addition to the magnetic recording medium 80 and the magnetic head 120, the magnetic recording and reproducing device 250 may further include, for example, a movable part that causes the magnetic recording medium 80 and the magnetic head 120 to move relative to each other while causing the magnetic recording medium 80 and the magnetic head 120 to oppose each other in a state in which the magnetic recording medium 80 and the magnetic head 120 are separated from each other or in contact with each other, a position controller that aligns the magnetic head 120 at a prescribed recording position of the magnetic recording medium 80, and the signal processor 290 that writes and reproduces signals to and from the magnetic recording medium by using the magnetic head 120.

The recording medium disk 280 is used as the magnetic recording medium 80 recited above. The movable part recited above may include the head slider 121. The position controller recited above also may Include the head gimbal assembly 258.

Figure 26:
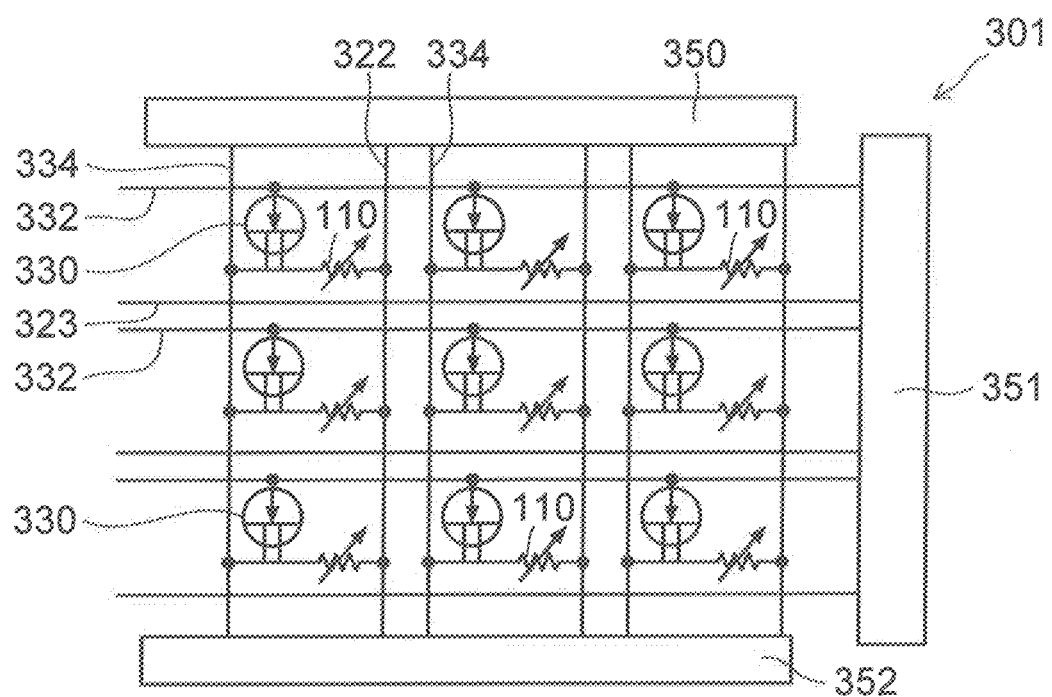
FIG. 26 is a schematic view illustrating the configuration of a magnetic memory according to a fourth embodiment.

FIG. 26 is a schematic view illustrating the configuration of a magnetic memory according to a fourth embodiment.

FIG. 26 illustrates a circuit configuration of the magnetic memory 301. The magnetic memory 301 includes multiple memory cells arranged in an array configuration.

As illustrated in FIG. 26, a column decoder 350 and a row decoder 351 are provided in the magnetic memory 301 to select one bit (one memory cell) inside the array. A switching transistor 330 is switched ON by a bit line 334 connected to the column decoder 350 and a word line 332 connected to the row decoder 351; and the memory cell (the magnetic element 100) is selected uniquely. The bit information that is recorded in the memory layer (the first magnetic layer 40) included in the magnetic element 100 is read by sensing the current flowing in the magnetic element 100 by using a sense amplifier 352.

When programming information to each memory cell, a program current is caused to flow in a designated program word line 323 and a designated bit line 322; and the magnetic field that is generated is applied to each memory cell.

Figure 27:
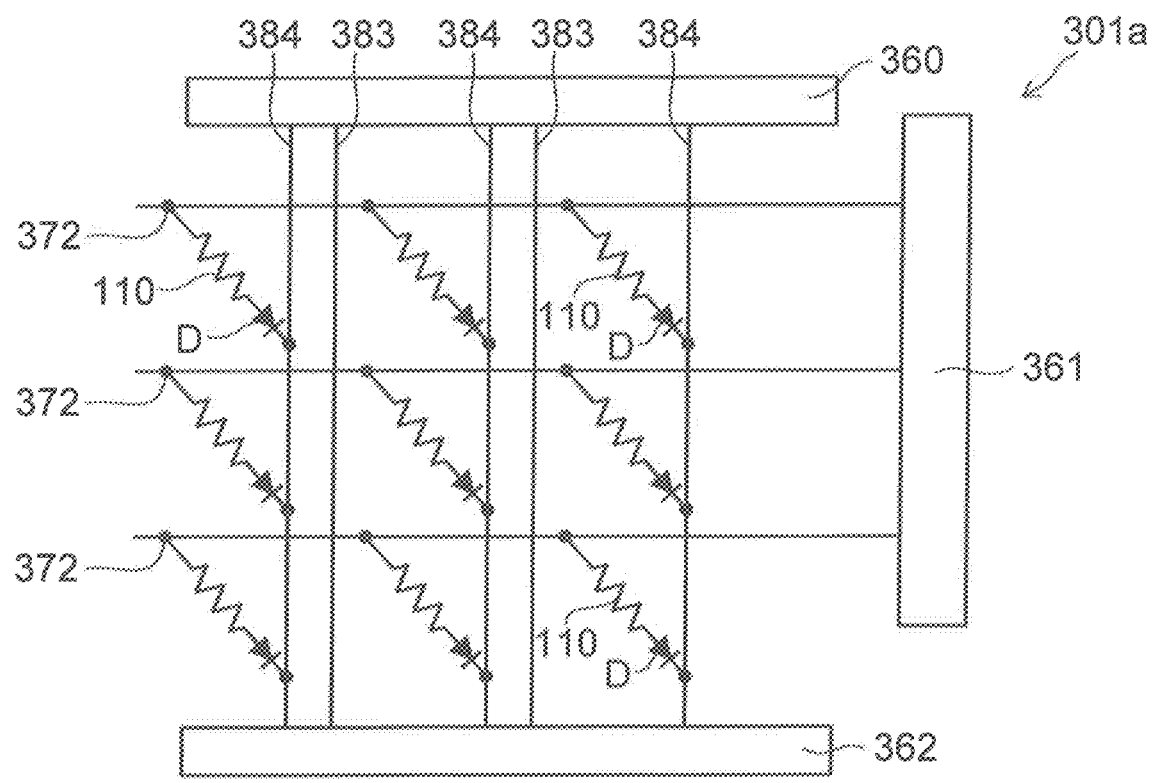
FIG. 27 is a schematic view illustrating the configuration of another magnetic memory according to the fourth embodiment.

FIG. 27 is a schematic view illustrating the configuration of another magnetic memory according to the fourth embodiment.

In the magnetic memory 301a as illustrated in FIG. 27, bit lines 372 and word lines 384 are interconnected in a matrix configuration and are selected by decoders 360, 361, and 362 to select a designated memory cell Inside the array. Each of the memory cells has a configuration in which the magnetic element 100 and a diode D are connected in series. The diode D suppresses the sense current from detouring into the memory cells other than the selected magnetic element 100. The programming is performed by a magnetic field generated by causing the program current to flow in a designated bit line 372 and a designated program word line 383.

Figure 28:
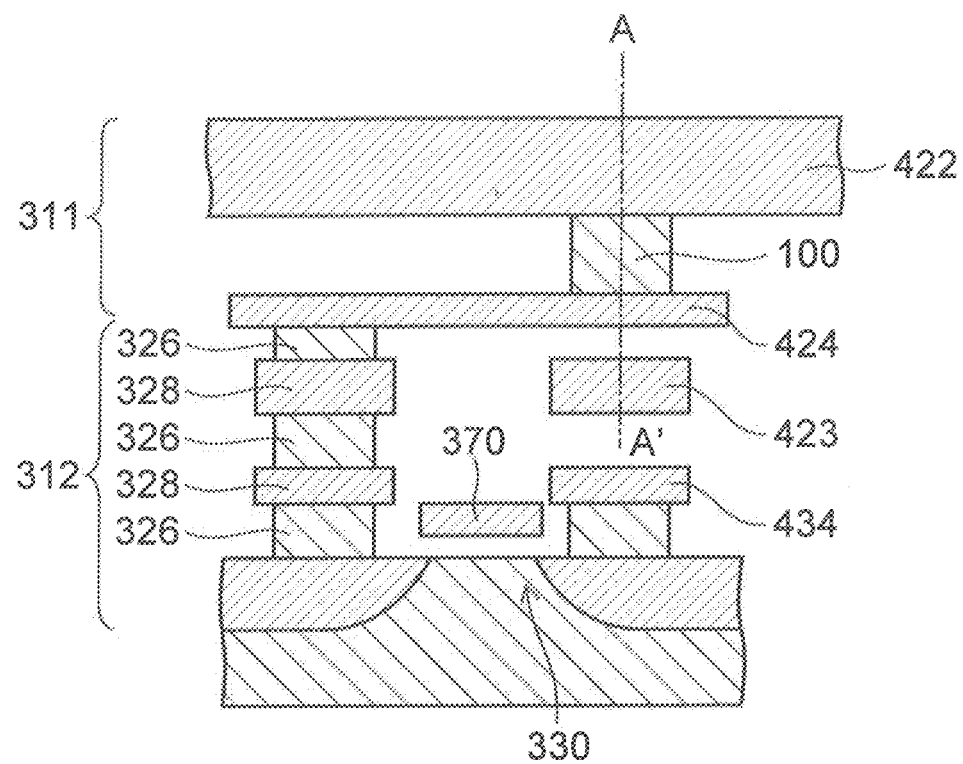
FIG. 28 is a schematic cross-sectional view illustrating the configuration of a magnetic memory according to the fourth embodiment.

FIG. 28 is a schematic cross-sectional view illustrating the configuration of a magnetic memory according to the fourth embodiment.

Figure 29:
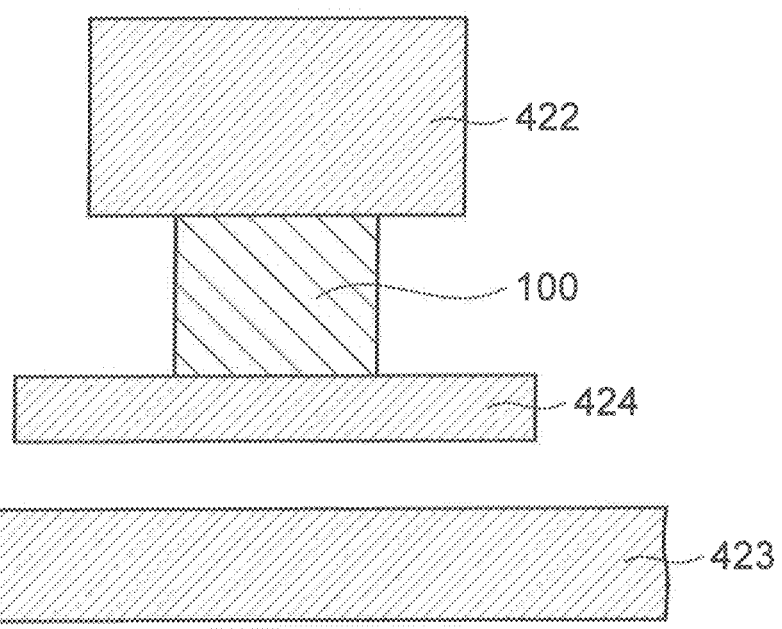
FIG. 29 is a line A-A' cross-sectional view of FIG. 28.

FIG. 29 is a line A-A' cross-sectional view of FIG. 28.

These drawings illustrate the configuration of the memory cell of one bit Included in the magnetic memory 301a, The memory cell includes a memory element portion 311 and an address selection transistor portion 312.

As illustrated in FIG. 28 and FIG. 29, the memory element portion 311 includes the magnetic element 100, and the pair of an interconnect 422 and an interconnect 424 that are connected to the magnetic element 100.

The switching transistor 330 that is connected by a via 326 and a buried interconnect 328 is provided in the address selection transistor portion 312. The switching transistor 330 performs a switching operation according to the voltage applied to a gate 370, and controls the opening and closing of the current path between the magnetic element 100 and an interconnect 434.

An interconnect 423 for programming is provided below the magnetic element 100 in a direction substantially orthogonal to the interconnect 422. The interconnect 422 and the interconnect 423 may be formed of, for example, at least one of aluminum (Al), copper (Cu), tungsten (W), or tantalum (Ta), or an alloy including any of these elements.

The interconnect 422 recited above corresponds to the bit line 322; and the interconnect 423 corresponds to the word line 323.

In a memory cell having such a configuration, when the bit information is programmed to the magnetic element 100, a program pulse current is caused to flow in the interconnects 422 and 423; and the magnetization of the memory layer of the magnetic element 100 is reversed as appropriate by applying a synthetic magnetic field induced by the current.

When reading the bit information; the sense current is caused to flow through the interconnect 422, the magnetic element 100 including the memory layer, and the interconnect 424; and the resistance value or the change of the resistance value of the magnetic element 100 is measured.

By using the magnetic element 100 according to the first embodiment in the magnetic memory 301 and 301a according to the embodiment, operations having a large MR ratio are possible; and highly reliable storing and reading are possible.

According to the embodiments recited above, a magnetic element, a pressure sensor, a magnetic head, and a magnetic memory are provided in which the MR ratio can be increased.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention Is not limited to these specific examples. For example, one skilled in the art may similarly practice the invention by appropriately selecting specific configurations of components such as the first electrode 51, the fourth layer 10, the first layer 12, the second layer 14, the third magnetic layer 20, the fourth magnetic layer 22, the second nonmagnetic layer 24, the second magnetic layer 26, the first nonmagnetic layer 30, the first magnetic layer 40, the cap layer 50, the second electrode 52, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all magnetic elements, all pressure sensors, all magnetic heads, and all magnetic memories practicable by an appropriate design modification by one skilled in the art based on the magnetic elements, the pressure sensors, the magnetic heads, and the magnetic memories described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic element, comprising:
a first layer including ruthenium;
a first magnetic layer;
a second magnetic layer provided between the first layer and the first magnetic layer;
a first nonmagnetic layer provided between the first magnetic layer and the second magnetic layer;
a second layer including tantalum, the second layer contacting the first layer and being provided between the first layer and the second magnetic layer, a lattice plane spacing of the second layer in a first direction being not less than 0.23 nm and not more than 0.25 nm, the first direction being from the first layer toward the first magnetic layer;
a third magnetic layer including manganese and being provided between the second layer and the second magnetic layer;
a fourth magnetic layer provided between the second magnetic layer and the third magnetic layer; and
a second nonmagnetic layer provided between the second magnetic layer and the fourth magnetic layer,
the second magnetic layer including iron, the fourth magnetic layer including iron, and the second nonmagnetic layer including ruthenium,
a spectrum of electron energy loss spectroscopy of iron having a first peak at a first position corresponding to the fourth magnetic layer and a third peak at a third position corresponding to the second magnetic layer,
a spectrum of electron energy loss spectroscopy of ruthenium having a second peak at a second position corresponding to the second nonmagnetic layer,
a spectrum of electron energy loss spectroscopy of manganese having a first value, a second value, a third value, a fourth value, and a fifth value, the first value corresponding to the first position, the second value corresponding to the second position, the third value corresponding to the third position, the fourth value corresponding to a fourth position corresponding to the first nonmagnetic layer, the fifth value corresponding to a fifth position corresponding to third magnetic layer,
the first value being larger than the second value,
the second value being larger than the third value,
a ratio of the fourth value to the fifth value is 0.04 or less, and
a ratio of the third value to the fifth value is 0.1 or less.

2. The element according to claim 1, wherein a composition ratio of tantalum in the second layer is 90 atomic % or more.

3. The element according to claim 1, wherein a thickness of the first layer along a direction from the first layer toward the first magnetic layer is not less than 1 nm but less than 10 nm.

4. The element according to claim 1, further comprising a third layer provided between the third magnetic layer and the second layer,
the third layer including at least one metal selected from the group consisting of ruthenium, chrome, and tantalum.

5. The element according to claim 1, further comprising a fourth layer including tantalum,
at least a portion of the fourth layer being amorphous,
the first layer being provided between the second layer and the fourth layer.

6. The element according to claim 1, wherein an electrical resistance of the magnetic element changes according to a strain of the first magnetic layer.

7. A pressure sensor, comprising:
a support portion;
a film portion supported by the support portion, the film portion being deformable; and
the magnetic element according to claim 1, the magnetic element being provided at the film portion,
an electrical resistance of the magnetic element changing according to a deformation of the film portion.

8. A magnetic head, comprising:
a suspension;
the magnetic element according to claim 1, the magnetic element being provided at one end of the suspension; and
an actuator arm connected to another end of the suspension.

9. A magnetic memory, comprising the magnetic element according to claim 1.

10. The element according to claim 1, wherein at least a portion of the second layer has a body-centered cubic structure having the (110) orientation.

11. The element according to claim 1, wherein the third value exceeds zero.

* * * * *